(12) United States Patent
Mifune et al.

(10) Patent No.: US 10,267,674 B2
(45) Date of Patent: Apr. 23, 2019

(54) ANALYSIS DEVICE AND ANALYSIS METHOD

(71) Applicant: MURATA MANUFACTURING CO., LTD., Kyoto-fu (JP)

(72) Inventors: Hiroshi Mifune, Kyoto-fu (JP); Seiji Hidaka, Kyoto-fu (JP); Yasuo Fujii, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 586 days.

(21) Appl. No.: 14/865,584

(22) Filed: Sep. 25, 2015

(65) Prior Publication Data

US 2016/0011040 A1 Jan. 14, 2016

Related U.S. Application Data

(63) Continuation of application No. PCT/JP2014/058809, filed on Mar. 27, 2014.

(30) Foreign Application Priority Data

Mar. 28, 2013 (JP) .................................. 2013-069619

(51) Int. Cl.
*G01H 17/00* (2006.01)
*G01H 11/08* (2006.01)
(Continued)

(52) U.S. Cl.
CPC ............... *G01H 17/00* (2013.01); *G01H 1/00* (2013.01); *G01H 11/08* (2013.01); *G06F 17/5018* (2013.01)

(58) Field of Classification Search
CPC ...... H01H 1/00; G06F 17/5018; G01H 17/00; G01H 1/00
(Continued)

(56) References Cited

U.S. PATENT DOCUMENTS

| 2008/0049376 A1* | 2/2008 | Stevenson | A61N 1/056 361/302 |
| 2014/0345926 A1* | 11/2014 | Lee | H01G 4/30 174/260 |
| 2015/0062775 A1* | 3/2015 | Shibasaki | H01G 4/30 361/301.4 |

FOREIGN PATENT DOCUMENTS

JP 2000-349360 A 12/2000

OTHER PUBLICATIONS

Multilayer Product Division, Multilayer Capacitor Mounting Technology Division, "Factor for and Measure of Mounting Method against 'Acoustic Noise' of Chip Multilayer Ceramic Capacitor" Metamorphosis, Murata Manufacturing Co., Ltd., No. 14, pp. 36-37, Dec. 2008.

(Continued)

*Primary Examiner* — John E Breene
*Assistant Examiner* — Jeffrey P Aiello
(74) *Attorney, Agent, or Firm* — Studebaker & Brackett PC

(57) ABSTRACT

An analysis device constructs an analytical model with a circuit board and a medium, and applies a concentrated load grouping composed of concentrated loads to the circuit board. In this case, the concentrated loads are established such that the sum of the respective vectors is zero, and such that the torque is zero with respect to the center of gravity. The analysis device applies a finite element method to the analytical model to figure out the vibration of the circuit board, which is caused when the concentrated loads vibrate with a constant period. The change in the pressure of the medium is computed from the vibration of the circuit board, and the change in the pressure is converted to a sound pressure.

5 Claims, 16 Drawing Sheets

(51) Int. Cl.
    *G01H 1/00*     (2006.01)
    *G06F 17/50*    (2006.01)

(58) Field of Classification Search
    USPC .............................. 702/22, 56, 63; 361/301.4
    See application file for complete search history.

(56) References Cited

OTHER PUBLICATIONS

N. Guibourg, "Reducing MLCCs' piezoelectric effects and audible noise" [online], EDN, Internet, Sep. 2012, <URL:http://www.edn.com/design/components-and-packaging/4397351/Reducing-MLCCs-piezoelectric-effects-and-audible-noise-?cid=EDNToday>.

T. Hosotani et al. "A Novel Multi-Resonant Current ZVS Converter Operated in Fixed Frequency" IEICE Technical Report vol. 110, No. 393, pp. 11-16, Jan. 20, 2011.

Lai et al., "Compensation Design for DC Blocking Multilayer Ceramic Capacitor in High-Speed Applications" IEEE Transactions on Components, Packaging and Manufacturing Technology, vol. 1, No. 5, pp. 742-751, May 2011.

International Search Report and Written Opinion from International Searching Authority from PCT/JP2014/058809 dated Jun. 24, 2014.

* cited by examiner

FIG. 19

| NUMBER OF MLCC | CONCENTRATED LOAD GROUPING | VALUE SET FOR PARAMETER OF CONCENTRATED LOAD ||||||
|---|---|---|---|---|---|---|---|
| | | L | W | Fx | Fy | Fz |
| 1 | CLG1 | L1 | W1 | Fx1 | Fy1 | Fz1 |
| 2 | CLG2 | L2 | W2 | Fx2 | Fy2 | Fz2 |
| 3 | CLG3 | L3 | W3 | Fx3 | Fy3 | Fz3 |
| ... | ... | ... | ... | ... | ... | ... |
| n | CLGn | Ln | Wn | Fxn | Fyn | Fzn |

44

ANALYSIS DEVICE AND ANALYSIS METHOD

CROSS REFERENCE TO RELATED APPLICATIONS

This application claims benefit of priority to Japanese Patent Application No. 2013-069619 filed Mar. 28, 2013, and International Patent Application No. PCT/JP2014/058809 filed Mar. 27, 2014, the entire content of each of which is incorporated herein by reference.

TECHNICAL FIELD

The present disclosure relates to an analysis device and analysis method which analyze an acoustic noise phenomenon of a circuit board with a multilayer ceramic capacitor mounted thereon.

BACKGROUND

Multilayer ceramic capacitors that are piezoelectric bodies are deformed when a voltage is applied. When a voltage that changes periodically is applied, the multilayer ceramic capacitors shrink in response to the period. In this regard, it is known that circuit boards with the multilayer ceramic capacitors mounted thereon generally vibrate to generate noise (for example, see Multilayer Product Division, Multilayer Capacitor Mounting Technology Division, "Factor for and Measure of Mounting Method against "Acoustic Noise" of Chip Multilayer Ceramic Capacitor", metamorphosis, Murata Manufacturing Co., Ltd., December 2008, No. 14, p. 36-37 and Nicolas Guibourg, "Reducing MLCCs' piezoelectric effects and audible noise", [online], September 2012, EDN, Internet <URL:http://www.edn.com/design/components-andpackaging/4397351/Reducing-MLCCs-piezoelectric-effects-and-audible-noise-?cid=EDNToday>). For example, in the case of mounting the multilayer ceramic capacitors on circuit boards of cellular phones, when such acoustic noise phenomena are caused, there is concern about even small noise because the circuit boards are located near ears. Thus, in order to take measures against acoustic noise phenomena, a finite element method is used to perform vibration analyses of the circuit boards with the multilayer ceramic capacitors mounted thereon.

SUMMARY

Now, the analyses of acoustic noise phenomena according to the prior art use a computation model (analytical model) having three kinds of solids: a multilayer ceramic capacitor; a circuit board; and a medium (for example, air). In this case, the multilayer ceramic capacitor is composed of a piezoelectric body, external electrodes, internal electrodes, a solder, a land pattern, etc. For this reason, in performing an analysis by a stereoscopic finite element method, a solid multilayer ceramic capacitor is reflected to perform mesh division of the computation model, and physical quantities are figured out over the entire model so that physical quantities of adjacent meshes are continuous consistently.

However, because the multilayer ceramic capacitor is a detailed solid model, the increased number of meshes increases the memory usage required for the computation, and has a tendency to also lengthen the calculation time. In addition, a large number (for example, ten or more) of multilayer ceramic capacitors may be used for a circuit board, and the analysis of an acoustic noise phenomenon in connection with such a circuit board has the problem of tremendously increasing the memory usage and the calculation time.

The present disclosure has been achieved in view of the above-mentioned problems of the prior art, and an object of the present disclosure is to provide an analysis device and an analysis method which can reduce the memory usage and the calculation time.

(1). In order to solve the problems mentioned above, the present disclosure provides an analysis device that uses a finite element method to analyze an acoustic noise phenomenon of a circuit board with a multilayer ceramic capacitor mounted thereon, which includes: a model construction that constructs an analytical model with the circuit board and a medium; a concentrated load grouping application that applies a concentrated load grouping composed of multiple concentrated loads configured such that the sum of the respective vectors is zero and such that the torque is zero with respect to the center of gravity, to the circuit board of the analytical model in accordance with the multilayer ceramic capacitor; a board vibration calculation that figures out vibration of the circuit board with the concentrated load grouping applied thereto, when the magnitudes of the respective concentrated loads are periodically changed with time; and a sound pressure calculation that figures out a sound pressure in the medium on the basis of the change in the pressure of the medium due to the vibration of the circuit board.

According to the present disclosure, the concentrated load grouping composed of the multiple concentrated loads is applied to the circuit board of the analytical model. In this case, in order to keep the circuit board from being moved or rotated, the multiple concentrated loads are established such that the sum of the respective vectors is zero, and such that the torque is zero with respect to the center of gravity. Thus, the load acting on the circuit board from the multilayer ceramic capacitor can be replaced with the multiple concentrated loads of the concentrated load grouping. As a result, the analytical model composed of the circuit board and the medium is just subjected to a vibration analysis with the use of a finite element method, and thus, as compared with a case of using a three-dimensional solid model as the multilayer ceramic capacitor, the memory usage and the calculation time can be reduced by reducing the division number of meshes.

(2). According to the present disclosure, the analysis device further includes a setting value determination that determines values set for the locations and magnitudes of the concentrated loads so that a calculation value for the sound pressure is close to an actual measurement value therefor.

According to the present disclosure, the setting value determination determines values set for the locations and magnitudes of the concentrated loads so that a calculation value for sound pressure is close to an actual measurement value therefor. For this reason, the sound pressure calculation can figure out a value for sound pressure, which is made close to an actual measurement value measured actually. Alternatively, when a three-dimensional solid model is used as the multilayer ceramic capacitor, because of the complex structure of the multilayer ceramic capacitor, the modeling is often insufficient, and there is a tendency to increase the deviation from the actual measurement value. In contrast, according to the present disclosure, the load acting on the circuit board from the multilayer ceramic capacitor is replaced with the multiple concentrated loads, and the calculation value for sound pressure can be thus made close to the actual measurement value by adjusting the locations and magnitudes for each concentrated load, and the operational precision of the sound pressure can be increased.

(3). According to the present disclosure, the setting value determination determines values set for the locations and magnitudes of the concentrated loads such that the calculation value for the sound pressure is close to the actual measurement value therefor around a band in which a maximal value is produced for the sound pressure when frequency characteristics are obtained for the sound pressure.

According to the present disclosure, the setting value determination determines values set for the locations and magnitudes of the concentrated loads so that a calculation value for sound pressure is close to an actual measurement value therefor around a band in which a maximal value for sound pressure is produced. For this reason, the calculation time required for the determination of the values set for the concentrated loads can be reduced as compared with when the calculation value for sound pressure is made close to the actual measurement value therefor over the entire band. In addition, the actual measurement value for sound pressure can be measured with a higher degree of accuracy around the band for the maximal value as compared with the other frequency range, the values set for the locations and magnitudes of the concentrated loads can be thus determined depending on the high-accuracy actual measurement value for sound pressure, and the operational precision of the sound pressure can be increased.

(4). According to the present disclosure, the analysis device further includes: a library registration that figures out values set for the locations and magnitudes of the concentrated loads for each type of the multilayer ceramic capacitor, and registers the set values in a library; and a setting value selection that selects, from the library, the values set for the concentrated loads depending on the type of the multilayer ceramic capacitor.

According to the present disclosure, the library registration registers, in the library, values set for the locations and magnitudes of concentrated loads for multiple types of multilayer ceramic capacitors.

For this reason, there is no need to figure out again any values set for the locations and magnitudes of the concentrated loads, but the setting value selection can easily analyze an acoustic noise phenomenon of the circuit board by selecting, from the library, values set for the concentrated loads depending on the type of the multilayer ceramic capacitor.

(5). The present disclosure provides an analysis method for using a finite element method to analyze an acoustic noise phenomenon of a circuit board with a multilayer ceramic capacitor mounted, which includes: a model construction step of constructing an analytical model with the circuit board and a medium; a concentrated load grouping application step of applying a concentrated load grouping composed of multiple concentrated loads configured such that the sum of the respective vectors is zero and such that the torque is zero with respect to the center of gravity, to the circuit board of the analytical model in accordance with the multilayer ceramic capacitor; a board vibration calculation step of figuring out vibration of the circuit board with the concentrated load grouping applied thereto, when the magnitudes of the respective concentrated loads are periodically changed with time; and a sound pressure calculation step of figuring out a sound pressure in the medium on the basis of the change in the pressure of the medium due to the vibration of the circuit board.

According to the present disclosure, the concentrated load grouping application step applies the concentrated load grouping composed of the multiple concentrated loads to the circuit board of the analytical model. In this case, in order to keep the circuit board from being moved or rotated, the multiple concentrated loads are established such that the sum of the respective vectors is zero, and such that the torque is zero with respect to the center of gravity. Thus, the load acting on the circuit board from the multilayer ceramic capacitor can be replaced with the multiple concentrated loads of the concentrated load grouping. As a result, the analytical model composed of the circuit board and the medium is just subjected to a vibration analysis with the use of a finite element method, and thus, as compared with a case of using a three-dimensional solid model as the multilayer ceramic capacitor, the memory usage and the calculation time can be reduced by reducing the division number of meshes.

BRIEF DESCRIPTION OF DRAWINGS

FIG. 19 is an explanatory diagram showing a library with parameters of concentrated loads recorded.

DETAILED DESCRIPTION

Analysis devices according to embodiments of the present disclosure will be described in detail below with reference to the accompanying drawings.

First, a multilayer ceramic capacitor 1 (hereinafter, referred to as an MLCC 1) and a circuit board 7 that are subjected to analysis on the acoustic noise phenomenon will be described.

Figure 1:
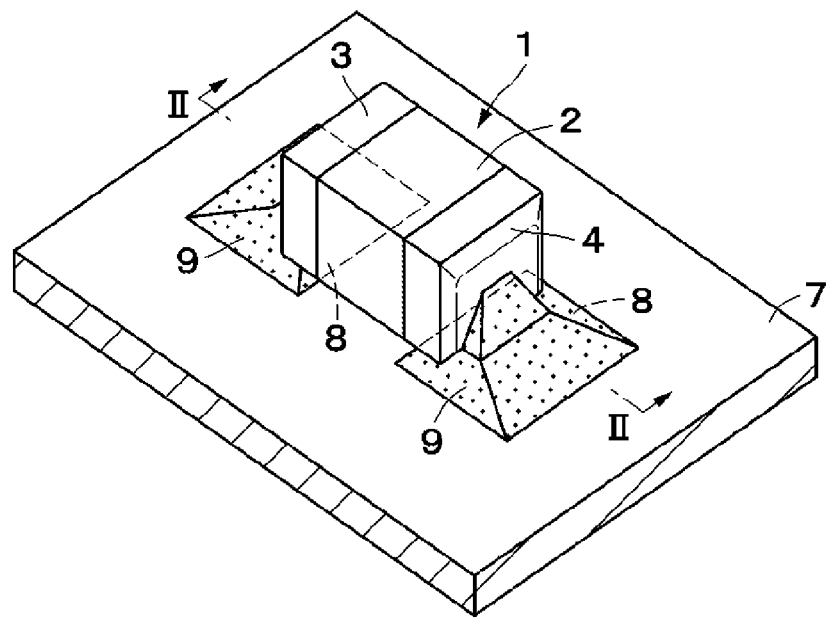
FIG. 1 is a perspective view illustrating a multilayer ceramic capacitor mounted on a circuit board.
Figure 2:
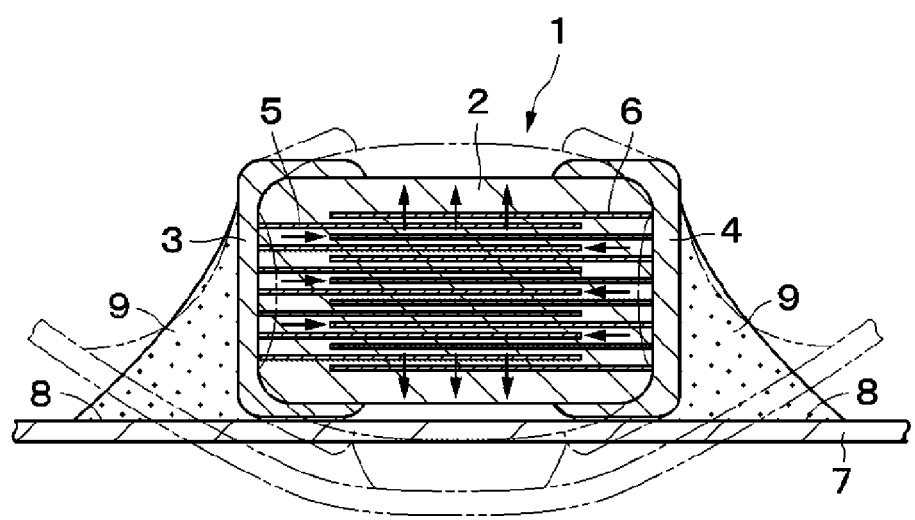
FIG. 2 is a cross-sectional view of the multilayer ceramic capacitor as viewed from the direction of arrow II-II in FIG. 1.

As shown in FIGS. 1 and 2, the MLCC 1 includes a piezoelectric body 2, external electrodes 3, 4, and internal electrodes 5, 6. The piezoelectric body 2 is formed from a piezoelectric insulating material, and for example, in the shape of a cuboid. The external electrodes 3, 4 are respectively provided on the outside of the piezoelectric body to be located on both ends in the length direction (X direction).

Within the piezoelectric body 2, the multiple internal electrodes 5, 6 are stacked alternately in the thickness direction (Z direction). The internal electrodes 5 are electrically connected to one external electrode 3, whereas the internal electrodes 6 are electrically connected to the other external electrode 4. In addition, the internal electrodes 5 and the internal electrodes 6 are separated from each other, and thus electrically insulated. It is to be noted that the internal electrodes 5, 6 may be stacked, such as, but not limited to the thickness direction (Z direction), and for example, in the width direction (Y direction).

The external electrodes 3, 4 of the MLCC 1 are joined to a land pattern 8 of the circuit board 7 with solder 9. Thus, the MLCC 1 is mounted on the circuit board 7. When a voltage that changes periodically is applied to the external electrodes 3, 4, the MLCC 1 shrinks, for example, in the thickness direction (Z direction) and the length direction (X direction) in response to the period.

This shrinkage of the MLCC 1 vibrates the whole circuit board 7 to generate noise.

Next, an analysis device 11 according to a first embodiment of the present disclosure will be described with reference to FIGS. 3 through 10.

Figure 3:
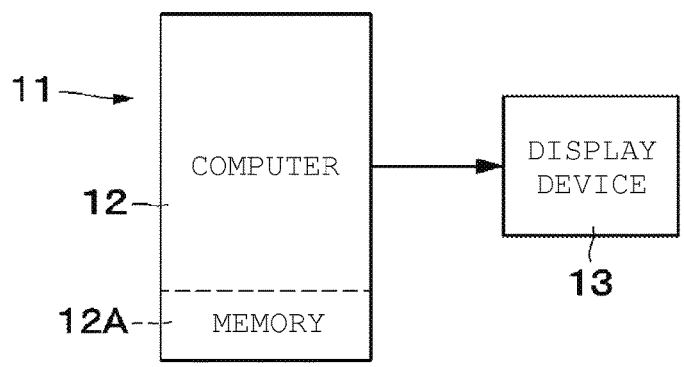
FIG. 3 is a configuration diagram illustrating an analysis device according to a first embodiment of the present disclosure.

FIG. 3 shows the general configuration of the analysis device 11 according to the first embodiment.

Figure 4:
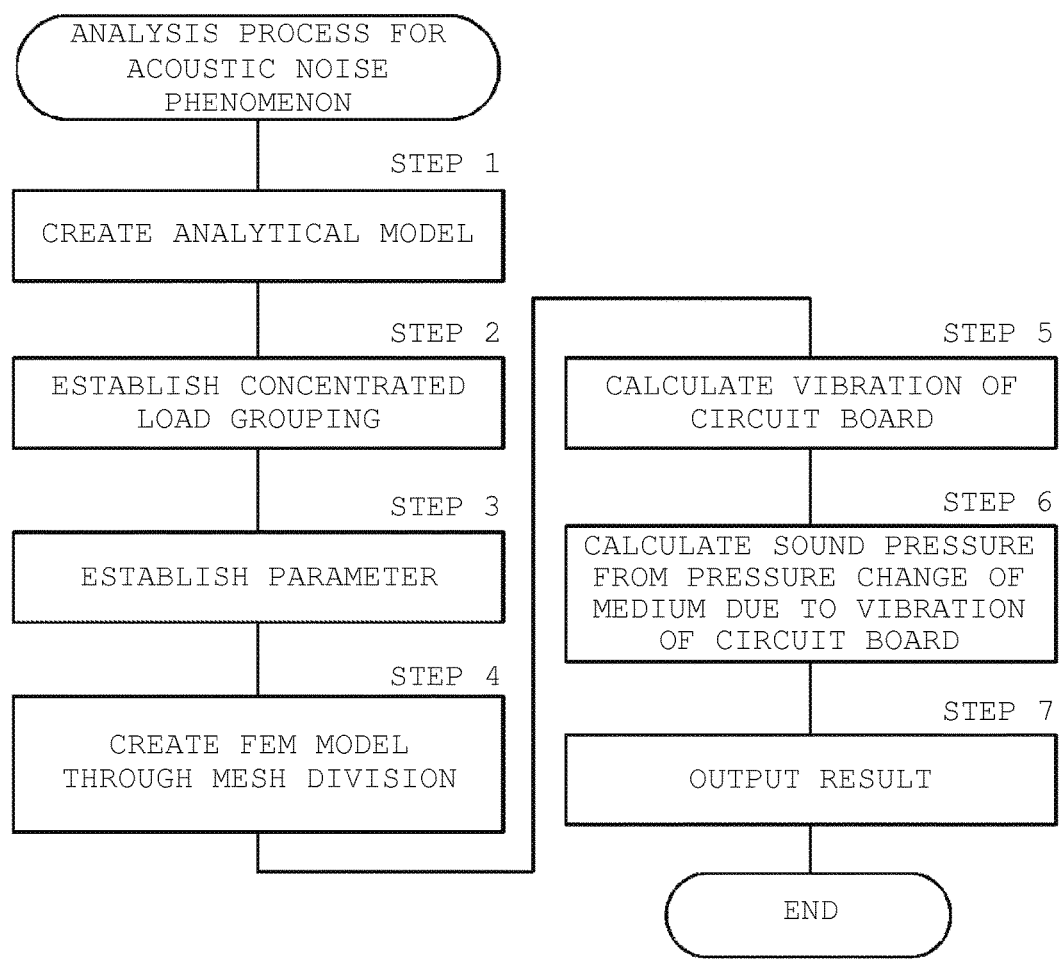
FIG. 4 is a flowchart showing an analysis process for an acoustic noise phenomenon with the analysis device in FIG. 3.

The analysis device 11 is composed of a computer 12. This computer 12 includes a memory 12A composed of a ROM, a RAM, or the like for storing an after-mentioned analysis program, etc., and has an output side connected to a display device 13. Thus, the computer 12 executes a program for an analysis process with the use of the finite element method as shown in FIG. 4, thereby analyzing an acoustic noise phenomenon caused by a circuit board 22.

Figure 5:
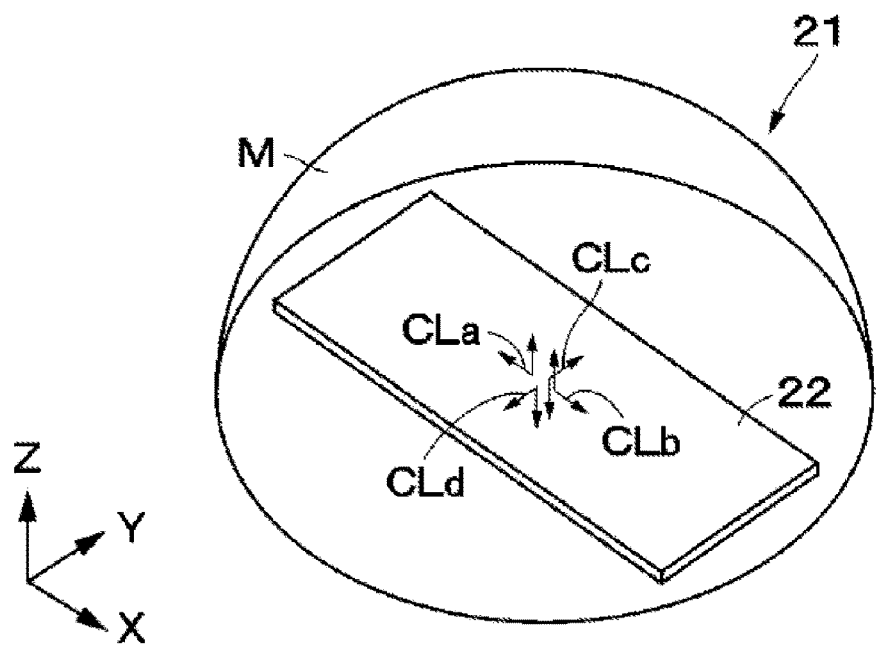
FIG. 5 is a perspective view illustrating an analytic model composed of a circuit board and a medium.
Figure 6:
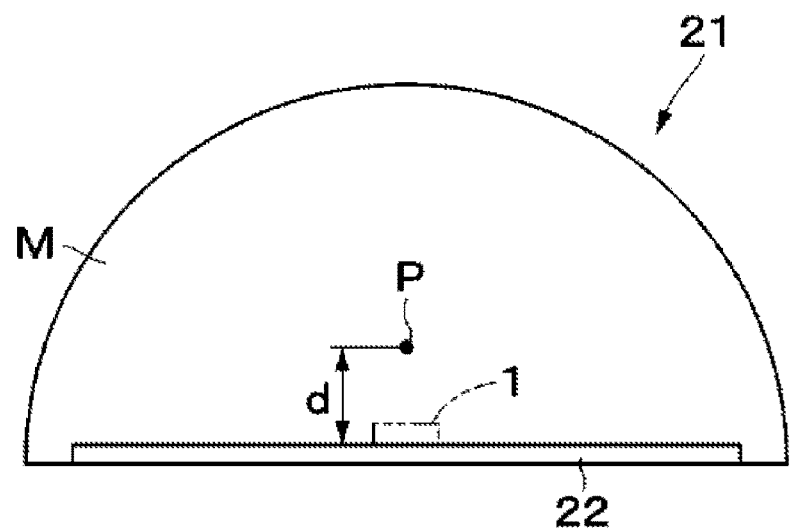
FIG. 6 is an explanatory diagram illustrating an observation point for a sound pressure in the analytical model.

Specifically, as shown in FIGS. 5 and 6, the circuit board 22 and a medium M constitute an analytical model 21, and the vibration of the MLCC 1 is replaced with vibrations of concentrated loads CLa to CLd, which are applied to the circuit board 22. This analytical model 21 is subjected to analysis of vibrations and changes in pressure on the basis of the finite element method, thereby figuring out a sound pressure at an observation point P determined in advance. This operation is repeated while varying the vibration frequencies of the concentrated loads CLa to CLd, thereby obtaining the sound pressure-frequency characteristics at the observation point P. The computer 12 displays, on the display device 13, the sound pressure-frequency characteristics obtained in this way.

Next, an analysis process for an acoustic noise phenomenon with the analysis device 11 will be described with reference to FIG. 4.

In Step 1, the circuit substrate 22 and the medium M that covers the circuit substrate 22, for example, such as air, constitute the analytical model 21 (see FIG. 5). In this case, the circuit substrate 22 corresponds to the circuit substrate 7 excluding the MLCC 1. In addition, the analytical model 21 is formed to be, for example, hemispherical with a circular bottom, and the bottom of the medium M and the bottom of the circuit substrate 22 are disposed in the same plane. In addition, the center position of the circuit substrate 22 is located in the center position at the bottom of the analytical model 21. For this reason, the center of the medium M and the center of the circuit board 22 are coincident with each other at the bottom.

It is to be noted that the configuration mentioned previously is adopted for the analytical model 21 in consideration of, for example, reduction in operation load, but not to be considered limited to the configuration. More specifically, the analytical model 21 is not limited to semispherical, but may be, for example, spherical, cubic, cylindrical, polyhedral, or the like. Furthermore, the position and shape of the circuit board 22 can be also changed appropriately.

In Step 2, a concentrated load grouping CLG composed of four concentrated loads CLa to CLd is applied to the circuit board 22 in the analytical model 21. In this case, the four concentrated loads CLa to CLd are established such that the sum of the respective vectors is zero, and such that the torque is zero with respect to the center of gravity G.

Figure 7:
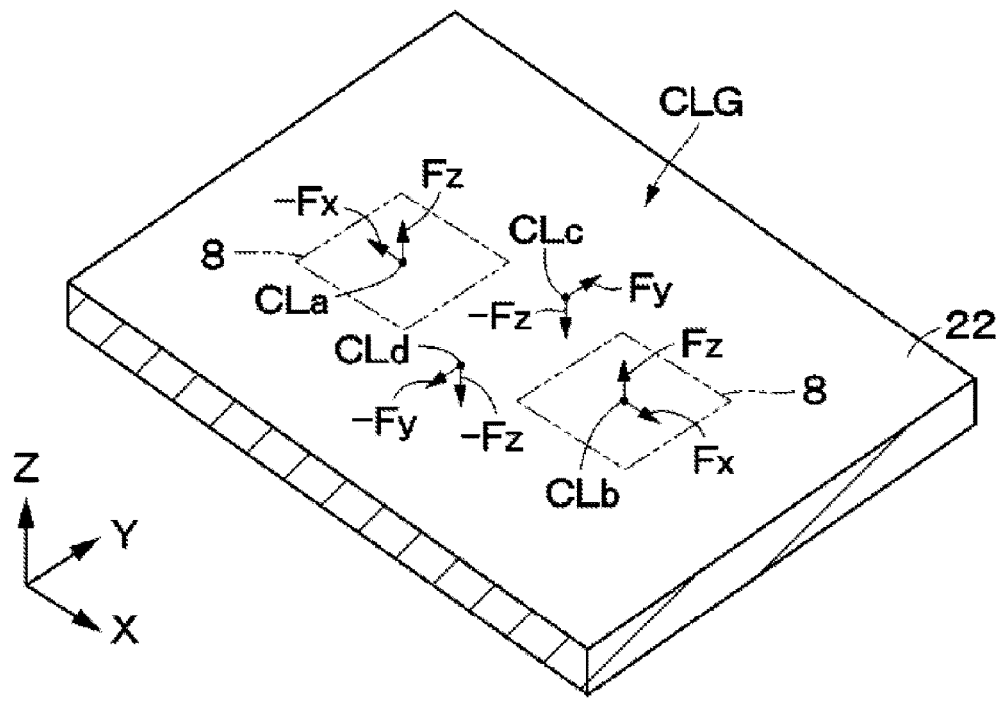
FIG. 7 is an enlarged perspective view illustrating a concentrated load grouping applied to the circuit board.
Figure 8:
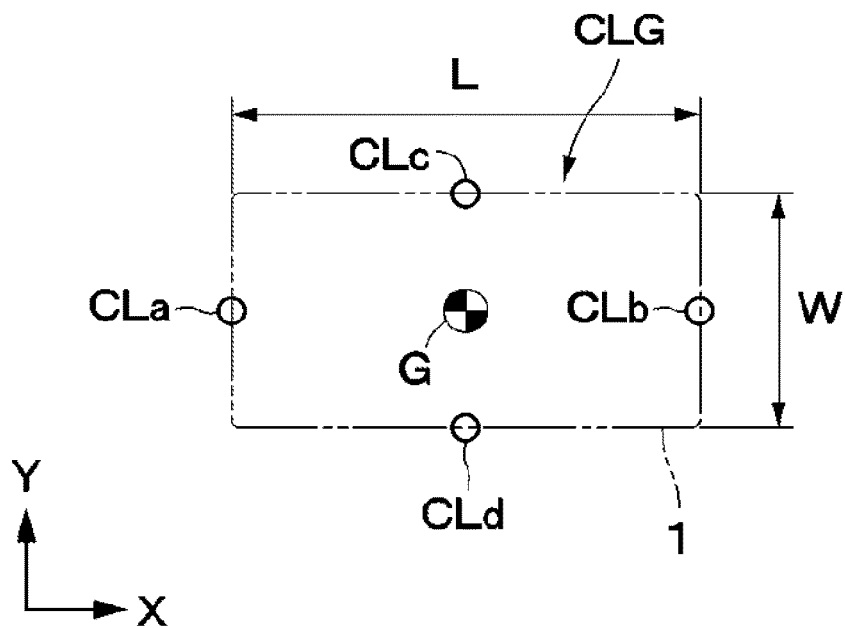
FIG. 8 is a plan view illustrating the arrangement relationship among four concentrated loads included in the concentrated load grouping.

FIGS. 7 and 8 show a specific example of the arrangement of the concentrated loads CLa to CLd. As shown in FIG. 8, the concentrated loads CLa, CLb are arranged in positions corresponding to both ends in the X direction (length direction) of the MLCC 1 on an X axis passing through the center of gravity G of the MLCC 1 in a plan view of the circuit board 22. On the other hand, the concentrated loads CLc, CLd are arranged in positions corresponding to both ends in the Y direction (width direction) of the MLCC 1 on a Y axis passing through the center of gravity G of the MLCC 1 in a plan view of the circuit board 22. For this reason, the concentrated loads CLa to CLd are arranged in a diamond shape. In this case, the concentrated load grouping CLG has the same length dimension L as the length dimension of the MLCC 1, and the same width dimension W as the width dimension of the MLCC 1. The direction of longer one (length dimension L) of the length dimension L and width dimension W of the concentrated load grouping CLG and the direction of a longer side of the circuit board 22 are coincident with each other. Likewise, the direction of the shorter one (width dimension W) of the length dimension L and width dimension W and the direction of a shorter side of the circuit board 22 are coincident with each other.

Further, the concentrated loads CLa, CLb have X-direction components (parameter Fx) that are equal in magnitude in the opposite direction from each other, and Z-direction components (parameter Fz) that are equal in magnitude in the same direction. The CLc, CLd have Y-direction components (parameter Fy) that are equal in magnitude in the opposite direction from each other, and Z-direction components (parameter Fz) that are equal in magnitude in the same direction. The Z-direction components of the concentrated loads CLa, CLb and the Z-direction components of the concentrated loads CLc, CLd are equal in magnitude in the opposite direction from each other. Thus, the four concentrated loads CLa to CLd are adapted such that the sum of the respective vectors is zero, and such that the torque is zero with respect to the center of gravity G.

It is to be noted that while a case of the concentrated load grouping CLG1 composed of the four concentrated loads CLa to CLd has been provided as an example, the number of concentrated loads is not to be considered limited to four as long as the concentrated loads can provide a planar load distribution. More specifically, the concentrated load grouping CLG may be composed of three concentrated loads, or composed of five or more concentrated loads. In addition, the arrangement of the four concentrated loads CLa to CLd is also not to be considered limited to the positions mentioned previously, but may be changed appropriately. For this reason, the length dimension L and width dimension W of the concentrated load grouping CLG are also not limited to the values mentioned previously, but can be changed appropriately to the extent that the vibration of the MLCC 1 is reflected to the circuit board 22.

In Step 3, values are set for the parameters L, W, Fx, Fy, Fz of the concentrated loads CLa to CLd. In this case, the parameter L indicates a dimension in the X direction (length direction) of the concentrated load grouping CLG, whereas the parameter W indicates a dimension in the Y direction (width direction) of the concentrated load grouping CLG. In addition, the parameter Fx indicates the magnitude of the X-direction load force of the concentrated load grouping CLG, Fy indicates the magnitude of the Y-direction load force of the concentrated load grouping CLG, and Fz indicates the magnitude of the Z-direction load force of the concentrated load grouping CLG. In this regard, the units of the parameters Fx, Fy, Fz are all (N) (newton).

The values of the parameters L, W are set to, for example, the length dimension and width dimension of the MLCC 1. On the other hand, the values of the parameters Fx, Fy, Fz are set to appropriate numerical values, for example, in consideration of measurement results, etc. for an actual MLCC 1.

Figure 9:
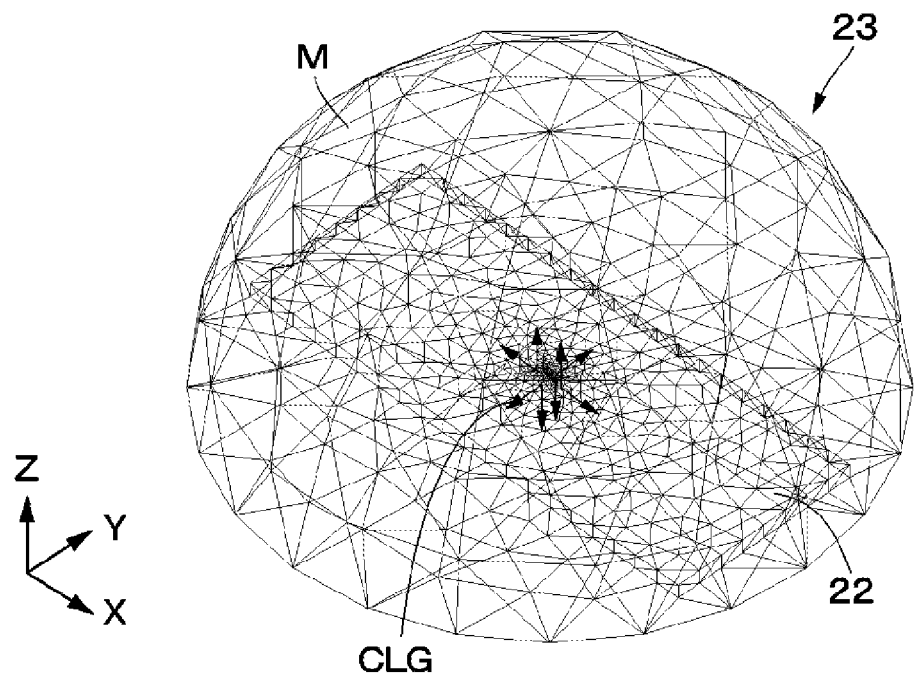
FIG. 9 is a perspective view illustrating a finite element model obtained by mesh division of the analytical model in FIG. 5.
Figure 10:
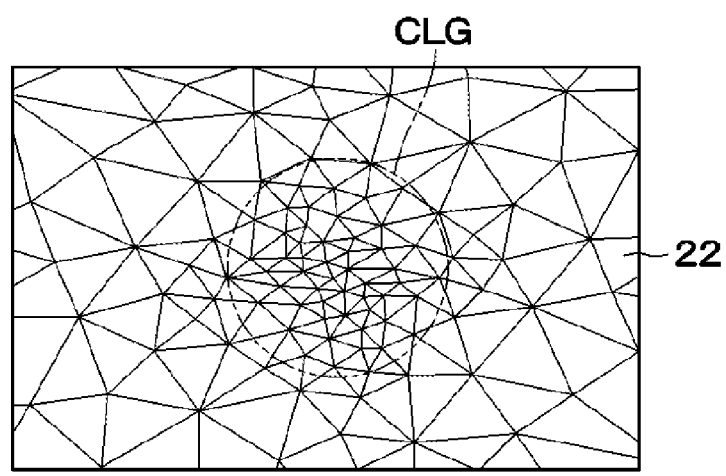
FIG. 10 is a perspective view illustrating an enlarged part of the circuit board in FIG. 9 near the concentrated load grouping.

In Step 4, a finite element model (hereinafter, referred to as a FEM model 23) is created by dividing the analytical model 21 into a finite large number of elements. Specifically, as shown in FIG. 9, the standard shapes of the circuit board 22 and medium M in the analytical model 21 are modeled to create the FEM model 23 divided into a number of finite elements by mesh division.

The elements include a tetrahedral solid element, a pentahedral solid element, and a hexahedral solid element, and these elements are specified point by point with the use of a three-dimensional coordinate (for example, an XYZ coordinate with the length direction of the circuit board 22 as an X axis, the width direction of the circuit board 22 as a Y axis, and the vertical axis as a Z axis). Furthermore, physical quantities such as stress and displacement within the mesh are allocated to the memory of the computer 12. It is to be noted that in order to increase the precision of the analysis result, and reduce the operation time, the mesh is finely formed around the concentrated load grouping CLG as compared with the other part in the mesh division (see FIG. 10).

In Step 5, a simultaneous equation based on a stiffness equation is solved for the circuit board 22 in the FEM model 23 to figure out the vibration of the circuit board 22. In this regard, the concentrated loads CLa to CLd of the concentrated load grouping CLG are vibrated sinusoidally at a frequency f within the range of a frequency band B determined in advance. Then, the vibration of the circuit board 22 is figured out at each frequency f, while varying the frequency f for each predetermined frequency spacing (for example, 100 Hz). Thus, the vibration of the circuit board 22 is figured out in the frequency band B.

In this regard, the frequency f is set within the range of the frequency band B of, for example, 10 kHz or less to which humans have high auditory sensitivity. It is to be noted that the frequency band B is, as a band to which humans have high auditory sensitivity, supposed to be set to, for example, 10 kHz or less, but if necessary, may be expanded to on the order of 20 kHz that is an upper limit frequency of a band that is audible to the human ear.

In Step 6, a simultaneous equation based on an equation for fluid motion is solved for the medium M in the FEM model 23 to figure out the change in the pressure of the medium M on the basis of the vibration of the circuit board 22. Then, this change in the pressure is converted to a sound pressure to figure out a sound pressure at the observation point P.

In this regard, the sound pressure level for each frequency f can be figured out, because the vibration of the circuit board 22 is computed for each frequency f at which the concentrated loads CLa to CLd vibrate in Step 5. For this reason, the sound pressure-frequency characteristics can be obtained in the frequency band B, and the sound pressure-frequency characteristics are recorded as calculation values.

It is to be noted that the observation point P is set, for example, in a position just at a predetermined distance dimension d (for example, d=3 mm) vertically from the circuit board 22 directly above the MLCC 1, as a position that easily undergoes changes in sound pressure level due to the vibration of the circuit board 22 (see FIG. 6).

In addition, the observation point P is not limited to the position mentioned previously, but may be in any position around the circuit board 22, as long as the position falls within the range of the analytic model 21, to the extent that the position undergoes changes in sound pressure level due to the vibration of the circuit board 22. However, in consideration of the sound pressure level, the observation point P is preferably set directly above the MLCC 1 which serves as a vibrating source.

In Step 7, the sound pressure-frequency characteristics recorded in Step 6 are on the display device 13. Thereafter, the process is ended.

Next, the analysis device 11 which uses the concentrated load grouping CLG will be compared with a comparative example which uses a solid model 31 for the MLCC 1.

Figure 11:
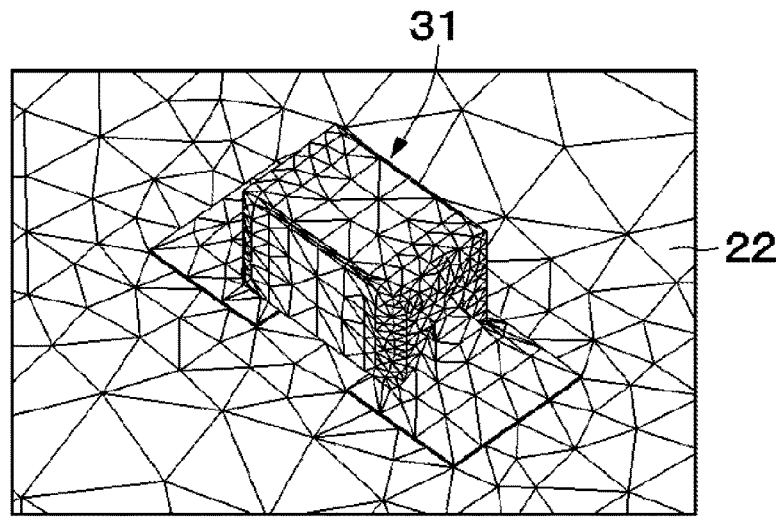
FIG. 11 is a perspective view illustrating a solid model for a multilayer ceramic capacitor according to a comparative example, which corresponds to FIG. 10.

It is to be noted that the comparative example is illustrated as the solid model 31 for the MLCC 1 as shown in FIG. 11, and a circuit board 22 and a medium M are, with the inclusion of the solid model 31, subjected to mesh division to configure a finite element model (FEM model). Then, a voltage at a predetermined frequency is applied to internal electrodes (not shown) in the solid model 31, and the deformation of the solid model 31 in this case is figured out with the use of a finite element method. The deformation of the solid model 31 propagates through solder to the circuit board 22, and the vibration of the circuit board 22 is thus analyzed on the basis of the analysis result for the deformation of the solid model 31. Thereafter, the change in the pressure of the medium M is figured out on the basis of the vibration of the circuit board 22, and a sound pressure is figured out from the pressure change.

Figure 12:
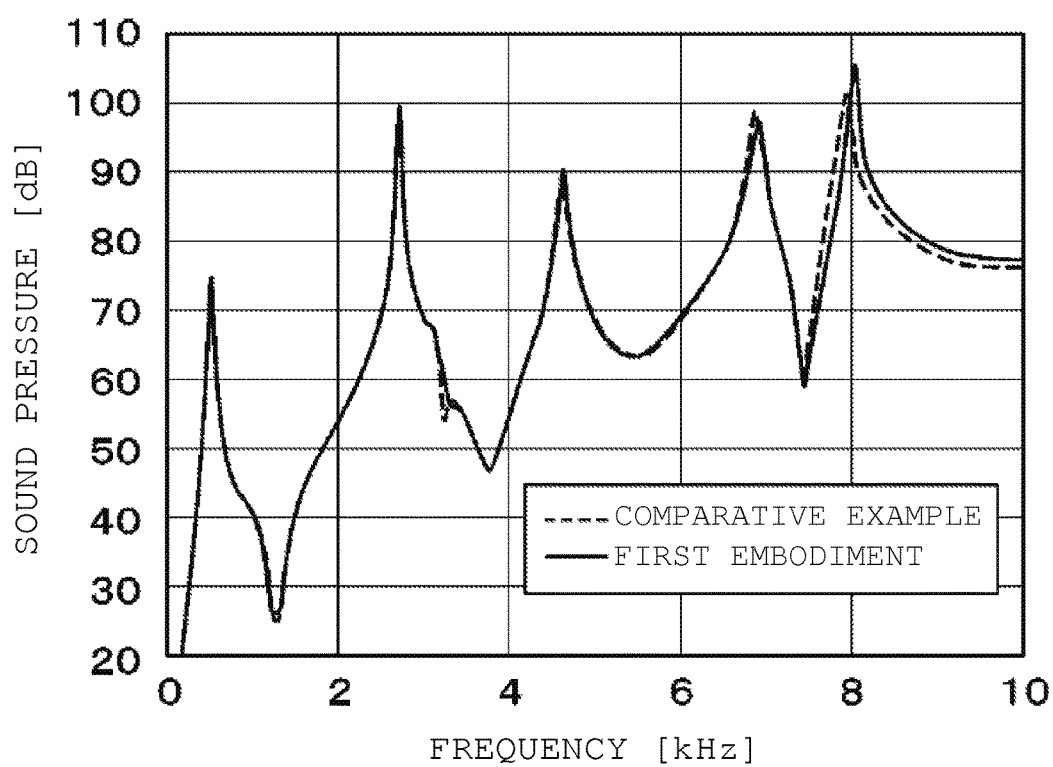
FIG. 12 is a characteristic line diagram showing sound pressure-frequency characteristics according to the comparative example and the first embodiment.

FIG. 12 shows sound pressure-frequency characteristics obtained with the analysis device 11, and sound pressure-frequency characteristics obtained according to the comparative example. It is to be noted that the circuit board 22 was made to be a rectangular plate with dimensions of 100 mm in the X direction, 40 mm in the Y direction, and 1.6 mm in the Z direction. The medium M was made semispherical with a radius of 60 mm.

In addition, the MLCC 1 for the solid model 31 was made cuboid with dimensions of 2 mm in the X direction, 1.2 mm in the Y direction, and 1.2 mm in the Z direction, the electrostatic capacitance was adjusted to 47 μF, and an alternating-current voltage of 1 Vpp was supposed to be applied with a direct-current bias voltage of 4 V.

On the other hand, in regard to the analysis device 11, the parameter L, parameter W, parameter Fx, parameter Fy, and parameter Fz of the concentrated loads CLa to CLd were set respectively to 2 mm, 1.2 mm, 0.31 N, 0.1 N, and 0.1 N.

As shown in FIG. 12, the analysis device 11 and the comparative example can obtain almost the same sound pressure-frequency characteristics. In this case, the number of meshes is 17581 in the comparative example. In contrast, in the analysis device 11 according to the first embodiment, the number of meshes is 8641, which can be reduced to approximately 48% as compared with the comparative example. More specifically, the memory usage of the computer 12 is generally proportional to the number of meshes, and the memory usage of the computer 12 can be thus also reduced to approximately half as compared with the comparative example.

In addition, the calculation time required for the sound pressure-frequency characteristics is approximately 14 minutes 4 seconds in the comparative example, but approximately 4 minutes and 36 seconds in the analysis device 11 according to the first embodiment. As just described, in the case of the analysis device 11 according to the first embodiment, the calculation time can be also reduced to on the order of 33% as compared with the comparative example.

Figure 13:
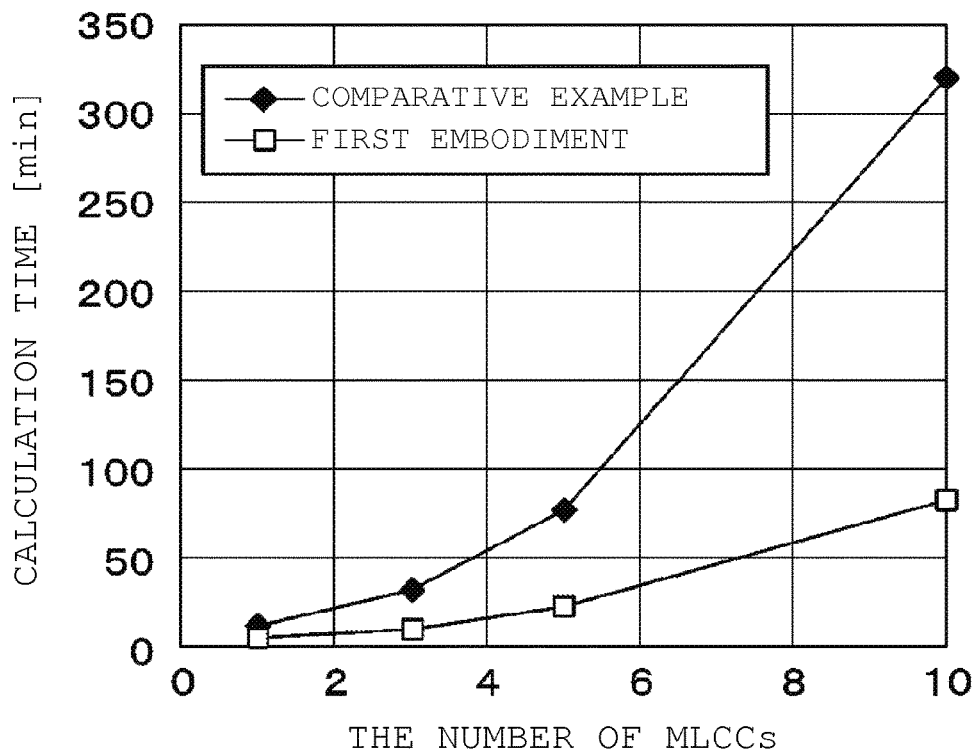
FIG. 13 is a characteristic line diagram showing the relationship between the number of multilayer ceramic capacitors and calculation time according to the comparative example and the first embodiment.
Figure 14:
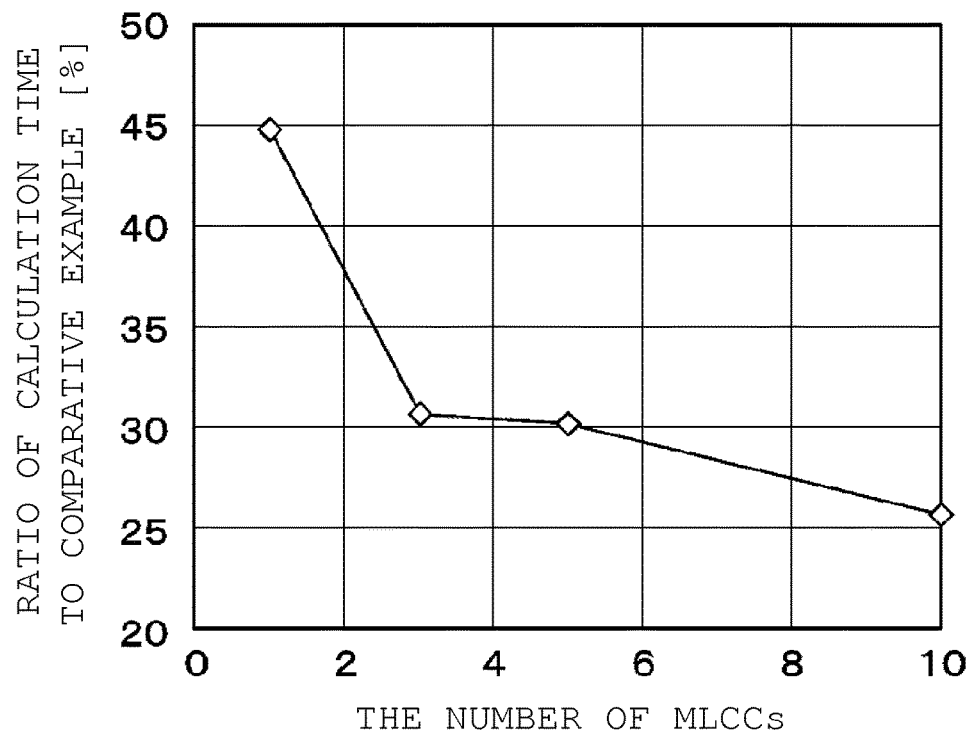
FIG. 14 is a characteristic line diagram showing the relationship between the number of multilayer ceramic capacitors and the ratio of calculation time to the comparative example.

Furthermore, for the analysis device 11 and the comparative example, the number of MLCCs 1 is increased to compare the calculation time. The results are shown in FIGS. 13 and 14. For example, in the case of ten MLCCs 1 mounted on the circuit board 22, the calculation time was 5 hours, 20 minutes, 44 seconds according to the comparative example, whereas the calculation time taken by the analysis device 11 was approximately 1 hour, 22 minutes, 14 seconds.

In the case of the comparative example, when the number of MLCCs 1 is increased, the solid model 31 is increased by the number of MLCCs 1, and the number of meshes is thus also increased by the increase of the model. As a result, as shown in FIG. 13, depending on the number of meshes, the number of unknowns is increased, and the calculation time is also increased. As is usually described in the finite element method, the calculation time is proportional to the cube of the unknown, and in the case of the comparative example, the memory usage and the calculation time are increased dramatically when the number of MLCCs 1 is increased.

In comparison, in the case of the analysis device 11 according to the first embodiment, even when the number of MLCCs 1 is increased, the number of meshes is just increased for the circuit board 22 and the medium M, and the number of meshes is reduced by omitting the solid model 31. As a result, the first embodiment can reduce the calculation time because of fewer unknowns of the simultaneous equation, as compared with the comparative example. As shown in FIG. 14, the foregoing effect of reducing the calculation time becomes pronounced as the number of MLCCs 1 is increased.

In this way, the first embodiment constructs the analytical model 21 composed of the circuit board 22 and the medium M, and applies the concentrated load grouping CLG composed of the four concentrated loads CLa to CLd to the circuit board 22. More specifically, the load acting on the circuit board 22 from the MLCC 1 is replaced with the four concentrated loads CLa to CLd. As a result, the analytical model 21 composed of the circuit board 22 and the medium M is just subjected to a vibration analysis with the use of a finite element method, and thus, as compared with a case of using the three-dimensional solid model 31 as the MLCC 1, the memory usage and the calculation time can be reduced by reducing the division number of meshes in the FEM model 23.

Next, a second embodiment of the present disclosure will be described with reference to FIGS. 15 through 25. A feature of the second embodiment consists in determining values set for the locations and magnitudes of concentrated loads so that a calculation value for sound pressure is close to an actual measurement value therefor. It is to be noted that in the second embodiment, the same constituent elements as in the first embodiment will be denoted by the same symbols, and the descriptions of the elements will be left out.

Figure 15:
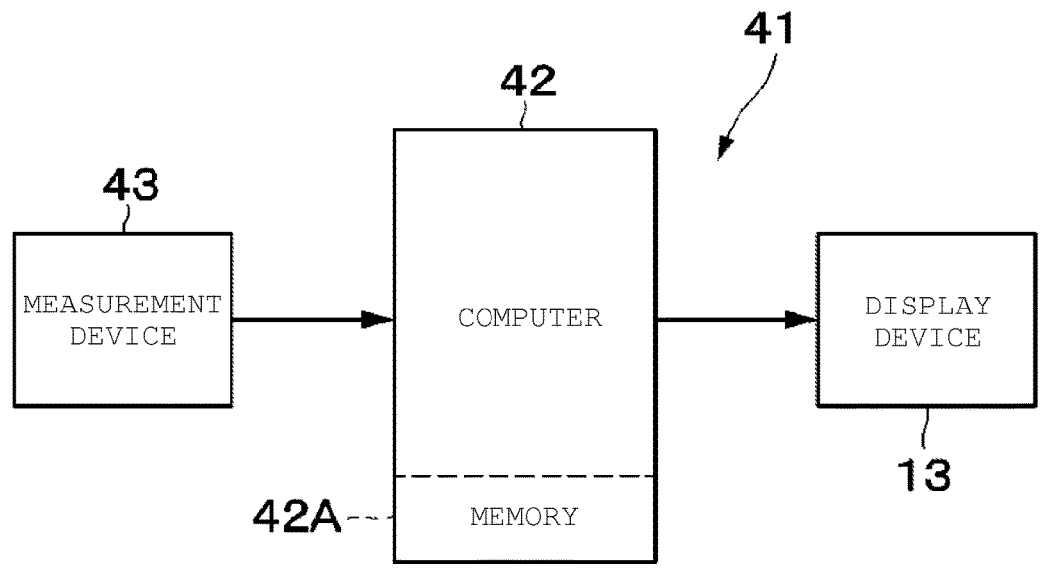
FIG. 15 is a configuration diagram illustrating an analysis device according to a second embodiment of the present disclosure.

FIG. 15 shows the general configuration of an analysis device 41 according to the second embodiment. The analysis device 41 is composed of a computer 42 and a measurement device 43 for measuring a sound pressure from a circuit board 7 with an MLCC 1 mounted thereon. The computer includes a memory 42A for storing an after-mentioned analysis program, etc., and has an input side connected to the measurement device 43 and an output side connected to a display device 13.

The measurement device 43 outputs measurement data measured by a microphone 43C to the computer 42. The computer stores, in the memory 42A, the measurement data as an actual measurement value for sound pressure. Then, the computer 42 uses the actual measurement value for sound pressure to derive values set for parameters Fx, Fy, Fz of concentrated loads. On that basis, the computer 42 uses the derived values set for the parameters Fx, Fy, Fz of the concentrated loads to analyze an acoustic noise phenomenon caused by an actual circuit board 52, and displays the result on the display device 13.

Next, the measurement device 43 for measuring an actual measurement value for sound pressure will be described.

Figure 16:
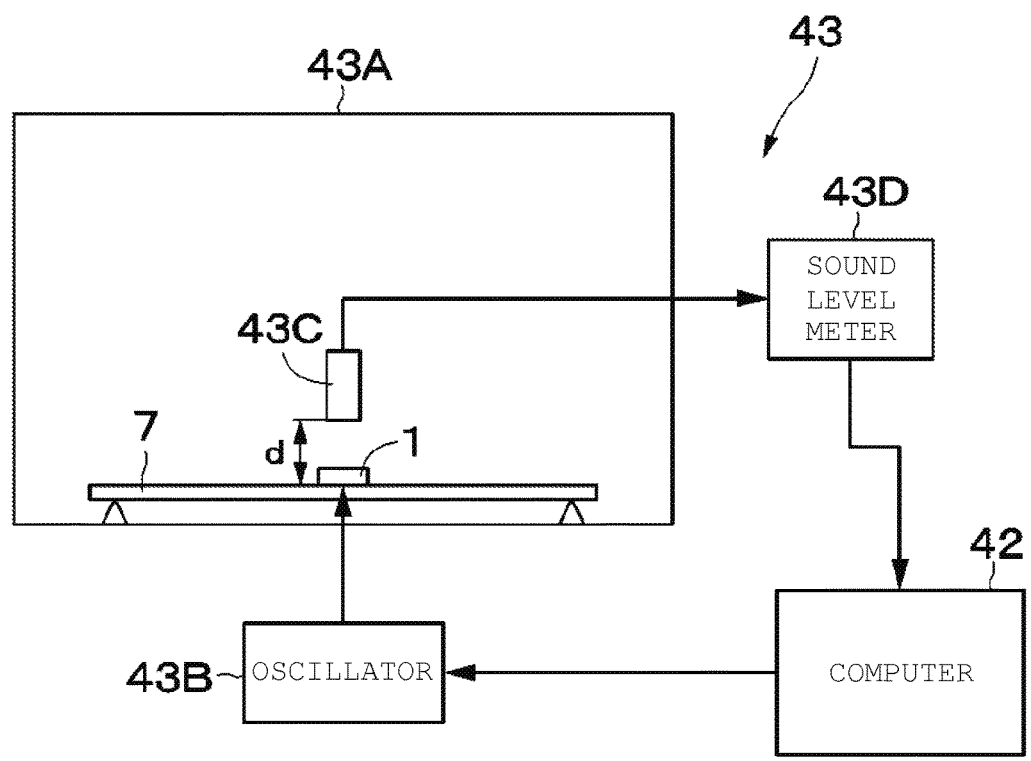
FIG. 16 is a configuration diagram illustrating a measurement device in FIG. 15.

As shown in FIG. 16, the measurement device 43 includes an anechonic box 43A, an oscillator 43B, the microphone 43C, and a sound level meter 43D. The anechonic box 43A is formed in the shape of a box with an acoustic wave absorption material provided on the inner surface of the box. Further, the circuit board 7 with the MLCC 1 mounted is disposed as an object to be measured within the anechonic box 43A. The MLCC 1 in the shape of a cuboid with dimensions of 1.6 mm in the X direction, 0.8 mm in the Y direction, and 0.8 mm in the Z direction, with electrostatic capacitance of 22 µF, will be described below as an example.

The oscillator 43B constitutes a signal input source, and inputs a sine wave signal with predetermined frequency f and amplitude to external electrodes 3, 4 of the MLCC 1. In this regard, the frequency f of the sine wave signal is controlled by the computer 42, and set within the range of a frequency band B of, for example, 10 kHz or less to which humans have high auditory sensitivity. For this reason, the oscillator 43B applies, as the sine wave signal, for example, an alternating-current voltage of 1 Vpp at 0 to 10 kHz along with a direct-current bias voltage on the order of 4 V, to the MLCC 1. It is to be noted that the frequency f and the amplitude are not limited to the values mentioned previously, but can be changed appropriately, for example, in consideration of the specifications, etc. of the actual MLCC 1.

The microphone 43C is a sound collecting microphone for collecting vibration sound (sound pressure) of the circuit board 7, which is disposed in the anechonic box 43A along with the circuit board 7, etc. This microphone 43C is disposed at an observation point P. This observation point P is set, for example, in a position just at a predetermined distance dimension d (for example, d=3 mm) vertically from the circuit board 7 directly above the MLCC 1.

The sound level meter 43D measures and records the sound pressure level of the sound collected by the microphone 43C. In addition, the sound level meter 43D is connected to the computer 42 to output the recorded sound pressure level to the computer 42. Thus, the computer 42 records the measured sound pressure level along with the frequency f of the sine wave signal from the oscillator 43B. The foregoing measuring operation is repeated while varying the frequency f for each predetermined frequency spacing (for example, 25 Hz), thereby acquiring sound pressure level-frequency characteristics in the frequency band B.

The circuit board 7 is used for the purpose of actually measuring the sound pressure of an acoustic noise caused by the MLCC 1 and deriving the parameters Fx, Fy, Fz of the concentrated loads CLa to CLd. For this reason, the circuit board 7 is used which is made in a simple shape, for example, such as a rectangular plate. The same circuit board 7 as illustrated in the first embodiment is used herein as an example. In this case, the circuit board 7 has length dimensions of, for example, 100 mm in the length direction (X direction), 40 mm in the width direction (Y direction), and 1.6 mm in the thickness direction (Z direction). It is to be noted that the shape of the circuit board 7 is not limited to the shape mentioned previously, but may be another shape such as a square, a polygon, or a circle. In addition, the size of the circuit board 7 can be also changed appropriately, for example, in consideration of the size, etc., of the circuit board actually applied.

Figure 17:
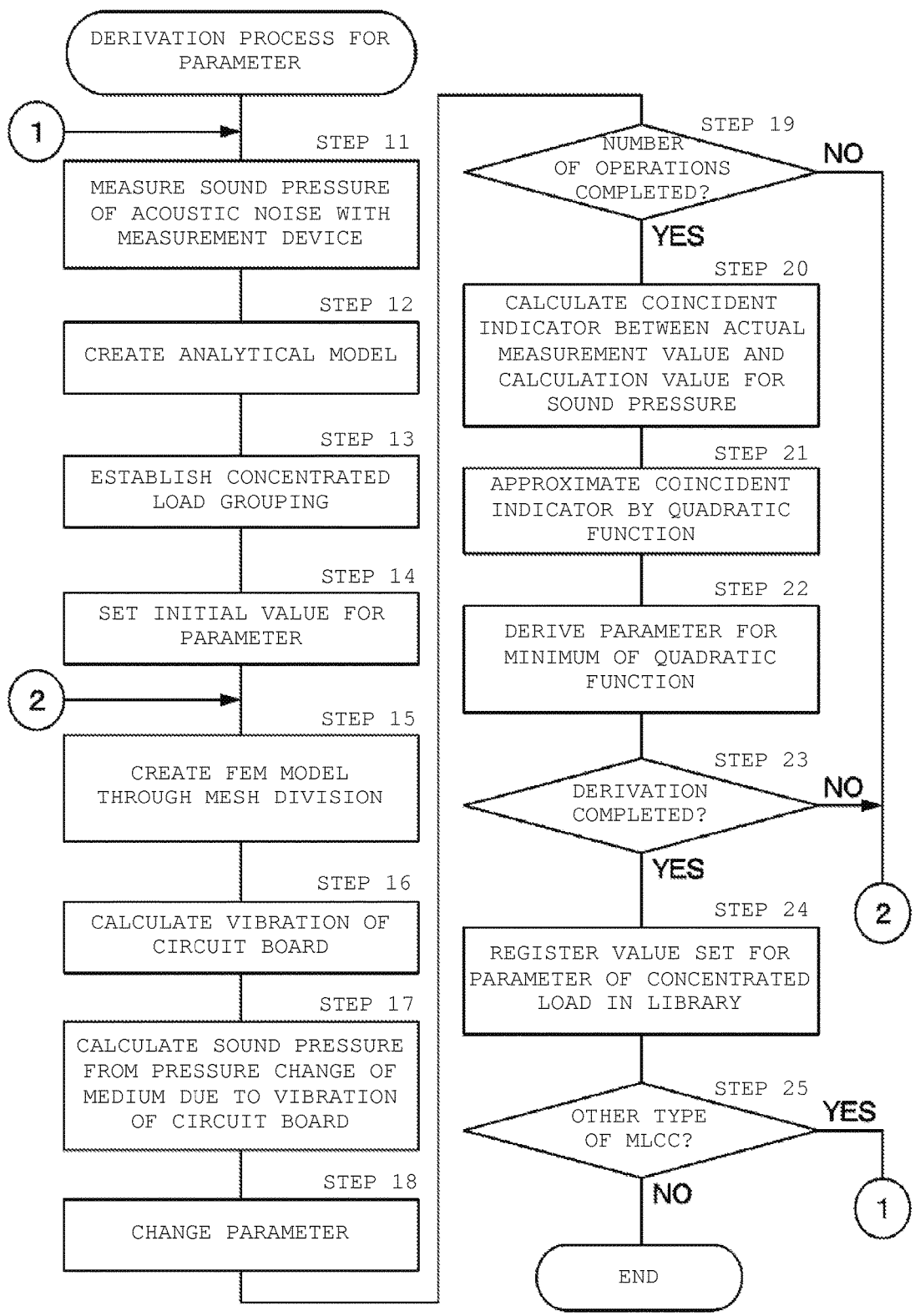
FIG. 17 is a flowchart showing a derivation process for parameter with the analysis device in FIG. 15.

Next, as a preparation step for an analysis process with the analysis device 41, a derivation process for parameters regarding the concentrated loads CLa to CLd will be described with reference to FIG. 17.

A case of derivation of parameters L, W, Fx, Fy, Fz of concentrated load groupings CLG1 to CLGn for and corresponding to n types of MLCCs 1 will be described herein as an example.

First, the circuit board 7 with the MLCC 1 mounted for deriving the parameters L, W, Fx, Fy, Fz is prepared in the measurement device 43. In this condition, the computer 42 executes a derivation process for the parameters as shown in FIG. 17.

In Step 11, the measurement device 43 is used to measure a sound pressure of the circuit board 7 with the MLCC mounted over the predetermined frequency band B. This measurement result is stored in the memory 42A of the computer 42.

In Step 12, an analytical model 21 is constructed which corresponds to the circuit board 7 with the MLCC 1 mounted thereon. As in the first embodiment, a circuit substrate 22 and a medium M that covers the circuit substrate 22, for example, such as air, constitute the analytical model (see FIG. 5). In this case, the circuit substrate 22 corresponds to the circuit substrate 7 excluding the MLCC 1. In addition, the analytical model 21 is formed to be, for example, semispherical with a circular bottom, and the center position of the circuit substrate 7 is located in the center position at the bottom.

In Step 13, a concentrated load grouping CLG1 composed of four concentrated loads CLa to CLd is applied to the circuit board 22 in the analytical model 21. In this case, the four concentrated loads CLa to CLD are established such that the sum of the respective vectors is zero, and such that the torque is zero with respect to the center of gravity G. This perspective is the same as in the first embodiment.

In Step 14, initial values are set for the parameters L, W, Fx, Fy, Fz of the concentrated loads CLa to CLd. The initial values of the parameters L, W are set to, for example, the length dimension (for example, L=1.6 mm) and width dimension (for example, L=0.8 mm) of the MLCC 1. On the other hand, for the initial values of the parameters Fx, Fy, Fz, for example, appropriate numerical values are set which are supposed to be assumable as finally set values.

In this regard, with the values of the parameter L, W fixed, the values set for the parameters Fx, Fy, Fz are adjusted on the basis of the actual measurement value for sound pressure. However, the present disclosure is not limited thereto, but the values set for the parameters L, W can be also adjusted by adopting the same adjustment method as for the parameters Fx, Fy, Fz.

In Step 15, a FEM model 23 is created by dividing the analytical model 21 into a finite large number of elements as in the first embodiment (see FIG. 9). Furthermore, physical quantities such as stress and displacement within the mesh are allocated to the memory of the computer 42. It is to be noted that in order to increase the precision of the analysis result, and reduce the operation time, the mesh is finely formed around the concentrated load grouping CLG1 as compared with the other part in the mesh division.

In Step 16, a simultaneous equation based on a stiffness equation is solved for the circuit board 22 in the FEM model 23 to figure out the vibration of the circuit board 22. In this regard, the concentrated loads CLa to CLd of the concentrated load grouping CLG1 are vibrated at a frequency f. Then, the vibration of the circuit board 22 is figured out at each frequency f, while varying the frequency f for each predetermined frequency spacing (for example, 25 Hz).

In Step 17, a simultaneous equation based on an equation for fluid motion is solved for the medium M in the FEM model 23 to figure out the change in the pressure of the medium M on the basis of the vibration of the circuit board 22. Then, this change in the pressure is converted to a sound pressure to figure out a sound pressure at the observation point P. In this regard, the sound pressure level for each frequency f can be figured out, because the vibration of the circuit board 22 is computed for each frequency f at which the concentrated loads CLa to CLd vibrate. For this reason, the sound pressure-frequency characteristics can be obtained in the frequency band B, and the sound pressure-frequency characteristics are recorded as calculation values.

Steps 15 to 17 have almost the same process as Steps 4 to 6 according to the first embodiment. Then, in Step 18, with one (for example, parameter Fx) of the parameters Fx, Fy, Fz varied by ΔF, the operation in Steps 15 to 18 is repeated until meeting the condition for determination in Step 19.

In this regard, at least three different values are set for each of the parameters Fx, Fy, Fz in Step 18. Further, in Step 19, it is determined whether a predetermined number of operations (for example, nine times) has been completed or not. If the determination is made to be "NO" in Step 19, the operation in Steps 15 to 18 is repeated. On the other hand, if the determination is made to be "YES" in Step 19, the process moves to Step 20.

It is to be noted that while a case of adjusting the three parameters Fx, Fy, Fz together by the single adjustment operation has been illustrated, the parameters Fx, Fy, Fz may be each individually adjusted. In this case, the predetermined number of operations for use in the determination of Step 19 can be, for example, three times.

In Step 20, for each of the calculation values of sound pressure-frequency characteristics for nine times, a coincident indicator is computed between the calculation value and the actual measurement value. In this regard, the coincident indicator refers to an indicator of how the actual measurement value for sound pressure is coincident with the calculation value therefor, and for example, a residual mean square is applied. In this case, the residual mean square refers to a mean value for the square of the difference between the actual measurement value and the calculation value for each frequency, and the reduced difference indicates increased characteristic coincidence.

This residual mean square may be calculated over the entire range of the frequency band B, but calculated for only the band around the maximum value (peak) of the sound pressure in consideration of reduction in calculation time and large measurement errors at low sound pressures, which are inappropriate for the indicator. The band around the maximum value of the sound pressure may be set, for example, in a frequency range in which the sound pressure is reduced by on the order of 2 to 10 dB with respect to the maximum value, or set in a predetermined frequency range (for example, on the order of ±25 to 100 Hz) around the frequency at which the maximum value is produced. It is to be noted that the residual mean square may be calculated for only the frequency at which the maximum value of the sound pressure is produced.

In Step 21, the coincidence indicator is approximated by a quadratic function, and a coefficient U0 for a minimal value of the quadratic function is figured out on the basis of the after-mentioned mathematical formula 2. In Step 22, the parameters Fx, Fy, Fz with which the quadratic function is minimal are figured out on the basis of the after-mentioned mathematical formula 3. How to figure out the parameters Fx, Fy, Fz will be described in detail below.

Figure 20:
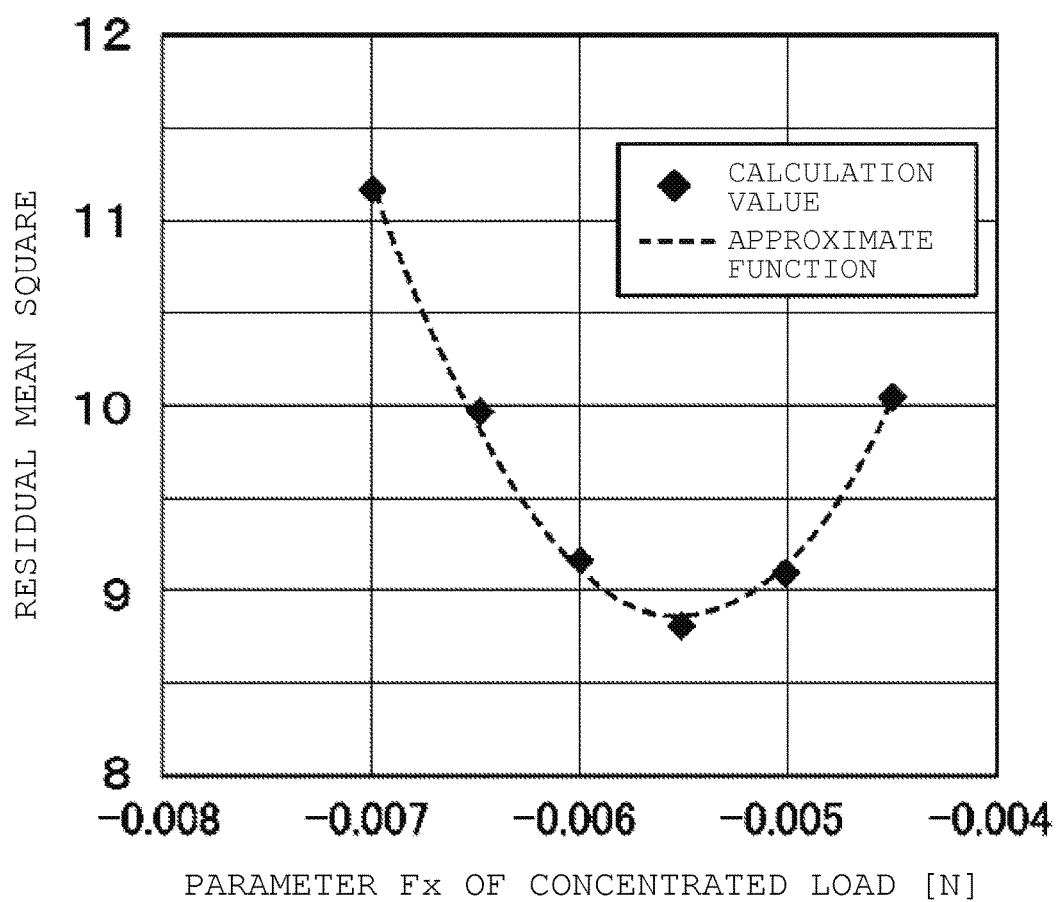
FIG. 20 is a characteristic line diagram showing the relationship between a parameter of a concentrated load and a residual mean square.

First, FIG. 20 shows the relationship between the parameter Fx and the residual mean square, which is obtained when only the parameter Fx is varied whereas the other parameters Fy, Fz are fixed. As shown in FIG. 20, the property of the residual mean square with respect to the parameter Fx can be approximated with accuracy by a quadratic function that is concave up. As just described, the relationship between the parameter Fx and the residual mean square can be approximated by a quadratic function, and thus, the minimal parameter Fx can be figured out when with the parameter Fx set to at least three different values, the residual mean square is computed for each value. Also as for the parameters Fy, Fz, the relationship with the residual mean square can be approximated by a quadratic function as in the case of the parameter Fx.

As a result, for the parameters Fx, Fy, Fz, the residual mean square V can be approximately expressed by the following mathematic formula 1. It is to be noted that a1, a2, b1, b2, c1, c2, and U in the mathematic formula 1 represent coefficients.

$$V = a1 \times Fx^2 + a2 \times Fx + b1 \times Fy^2 + b2 \times Fy + C1 \times Fz^2 + c2 \times Fz + U \quad (1)$$

The mathematical formula 1 can be transformed into the mathematical formula 2.

$$V = a1\left(Fx + \frac{a2}{2a1}\right)^2 + b1\left(Fy + \frac{b2}{2b1}\right)^2 + c1\left(Fz + \frac{c2}{2c1}\right)^2 + U0 \quad \text{(Formula 2)}$$

The residual mean square V is minimal when the first to third terms are zero on the right side of the mathematical formula 2. For this reason, the parameters Fx, Fy, Fz for which the residual mean square V is minimal can be figured out on the basis of a mathematical formula 3. In this regard, the coefficient U0 in the mathematical formula 2 is a minimal value for the residual mean square V.

$$Fx = -\frac{a2}{2a1}, Fy = -\frac{b2}{2b1}, Fz = -\frac{c2}{2c1} \quad \text{(Formula 3)}$$

As just described above, the parameters Fx, Fy, Fz for which the residual mean square V is minimal can be figured out through the approximation by quadratic functions, which is absolutely an approximation, but not supposed to figure out any theoretical minimum. For this reason, with the parameters Fx, Fy, Fz figured out once as starting points, the residual mean square V is again approximated by quadratic functions to figure out the parameters Fx, Fy, Fz for minimum values sequentially. This operation can be repeated to search a group of parameters Fx, Fy, Fz for which the residual mean square V is smaller gradually.

When Step 22 is completed, the process moves to Step 23 to determine whether the condition for the completion of parameter derivation is met or not. Specifically, it is determined whether the minimal value (coefficient U0) for the residual mean square V converges to a value within a predetermined range or not, or reaches a specified number of repetitions or not.

Then, if the two conditions for the completion both fail to be met, the determination is made to be "NO" in Step 23, and the process from Step 15 is repeated to sequentially update the values of the parameters Fx, Fy, Fz. On the other hand, if at least any one of the conditions is met, the determination is made to be "YES" in Step 23, and the process moves to Step 24 in which the current parameters Fx, Fy, Fz are registered in a library 44 along with the parameters L, W in conjunction with the MLCC 1 (see FIG. 19). Thus, values set for the parameters L1, W1, Fx1, Fy1, Fz1, which correspond to the concentrated load grouping CLG1 for the MLCC 1, are registered in the library 44.

In Step 25, for the other different type of MLCC 1, it is determined whether to derive the parameters L, W, Fx, Fy, and Fz of the concentrated loads CLa to CLd or not. The different type of MLCC 1 herein refers to an MLCC1 that differs in, for example, electrostatic capacitance, the shape, size, or material constant of the piezoelectric body 2, the shapes, sizes, or arrangement of the electrodes 3 to 6, etc.

If the determination is made to be "YES" in Step 25, the process from Step 11 is executed, and the parameters L, W, Fx, Fy, Fz figured out for the other type of MLCC 1 are registered in the library 44. Thus, values set for the parameters L2, W2, Fx2, Fy2, Fz2, which correspond to the concentrated load grouping CLG2 for the other type of MLCC 1, are registered in the library 44. Accordingly, through the repetition of the foregoing operation, for example, when there are n types of MLCC 1, n values set for each of L1 to Ln, W1 to Wn, Fx1 to Fxn, Fy1 to Fyn, and Fz1 to Fzn are registered in the library 44 to correspond to concentrated load groupings CLG1 to CLGn, depending on the number of types for the MLCC 1.

On the other hand, when the determination is made to be "NO" in Step 25, the registration of values set for the parameters L1 to Ln, W1 to Wn, Fx1 to Fxn, Fy1 to Fyn, and Fz1 to Fzn is completed for all of the types of MLCCs 1.

It is to be noted that a case of setting the parameters L, W, Fx, Fy, Fz of the concentrated load groupings CLG1 to CLGn for and corresponding to multiple types (n types) of MLCCs 1 has been described previously as an example. However, the present disclosure is not limited to this example, but for example, for and corresponding to one type of MLCC 1, the parameters L, W, Fx, Fy, Fz of the concentrated load grouping CLG may be derived.

In order to confirm effectiveness of the derivation process for the parameters, sound pressure-frequency characteristics were obtained for each case of using initial values for the parameters Fx, Fy, Fz of the concentrated loads CLa to CLd and using values set after the derivation. The results are shown in FIGS. 21 and 22.

In this regard, as the initial values for the parameters Fx, Fy, Fz, for example, the parameters Fx, Fy, and Fz are set respectively to 0.01 N, 0.001 N, and 0.01 N. As shown in FIG. 21, in the case of using the initial values, calculation values for sound pressure are deviated away from actual measurement values, and the residual mean square in this case is on the order of 33.3.

Figure 21:
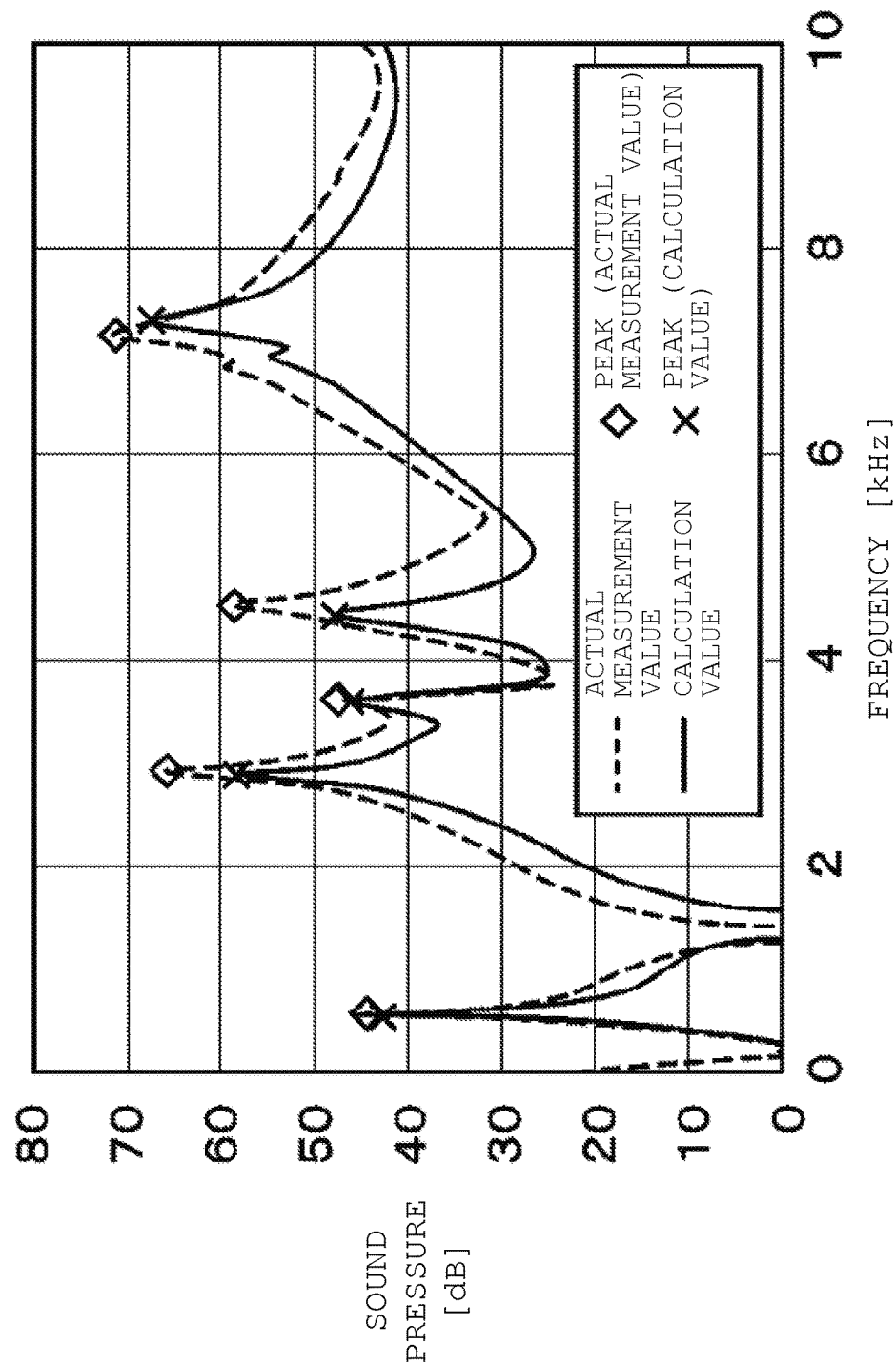
FIG. 21 is a characteristic line diagram showing sound pressure-frequency characteristics calculated with an analysis device in the case of using an initial value for a parameter.
Figure 22:
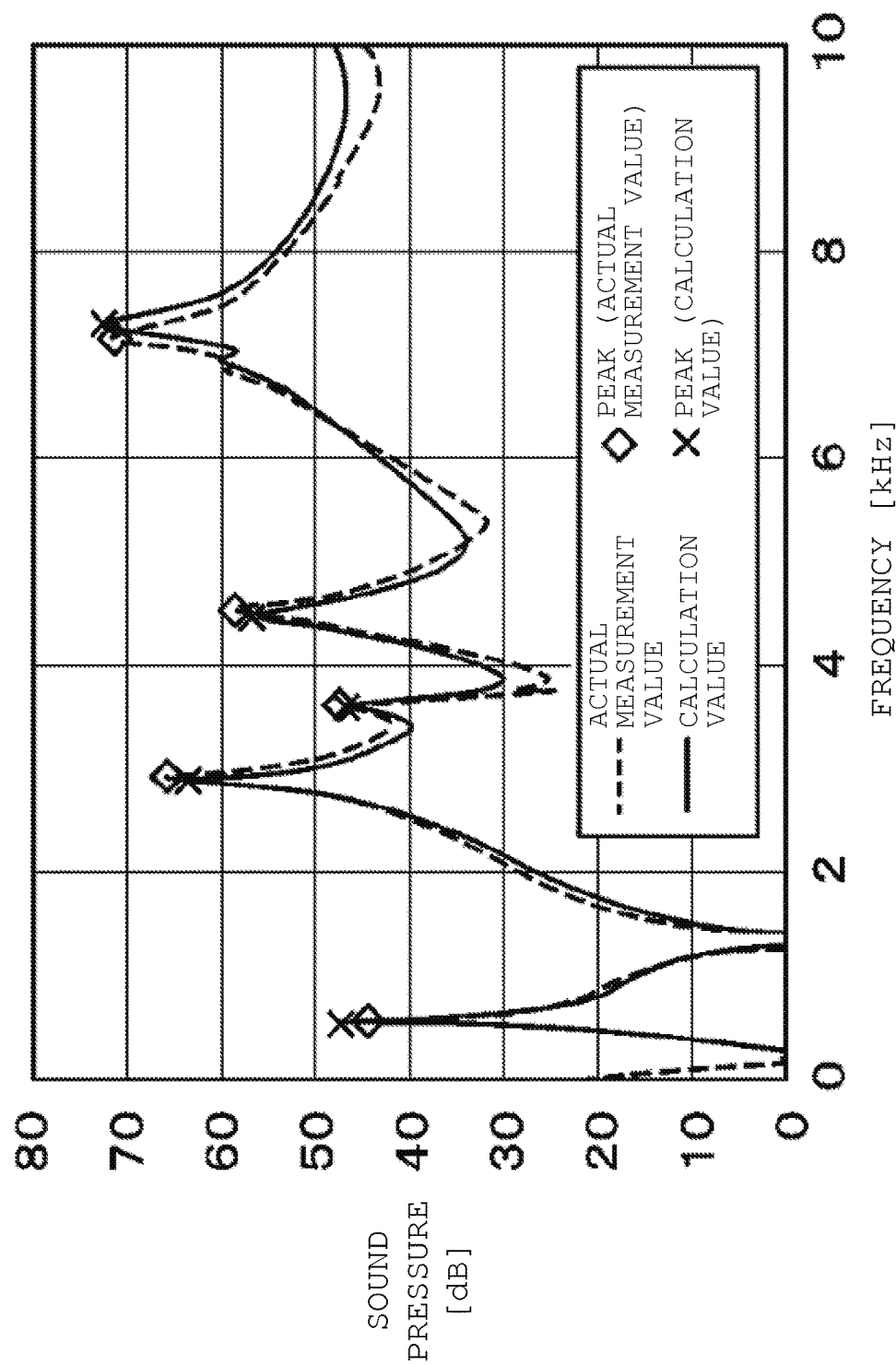
FIG. 22 is a characteristic line diagram showing sound pressure-frequency characteristics calculated with an analysis device in the case of using a value set for a derived parameter.

On the other hand, the values set for the parameters Fx, Fy, Fz are values derived finally by the previously described derivation process for the parameters under the same condition as for FIG. 21, and for example, the parameters Fx, Fy, and Fz are set respectively to −0.0212 N, −0.0014 N, and 0.0108 N. As shown in FIG. 22, as compared with the case of using the initial values for the parameters Fx, Fy, Fz, calculation values for sound pressure are closer to actual measurement values, and the residual mean square is decreased to on the order of 4.8. As just described, calculation values for sound pressure can be made close to actual measurement values with accuracy by adjusting a small number of parameters in the present embodiment.

It is to be noted that the calculation time, for example, on the order of 23 minutes was required for derivation of the parameters Fx, Fy, Fz. However, it is only necessary to execute the derivation of the parameters Fx, Fy, Fz once for each type of MLCC 1, and the calculation time required for the derivation is not required at the stage of utilizing an after-mentioned analysis process.

Next, as a stage of utilizing an analysis process with the analysis device 41, an analysis process for an acoustic noise phenomenon with the use of the library 44 will be described with reference to FIG. 18.

A case of analyzing sound pressure characteristics for the circuit board 52 with one for each of ten types of MLCCs 1 mounted thereon as ten in total will be described herein as an example.

Figure 23:
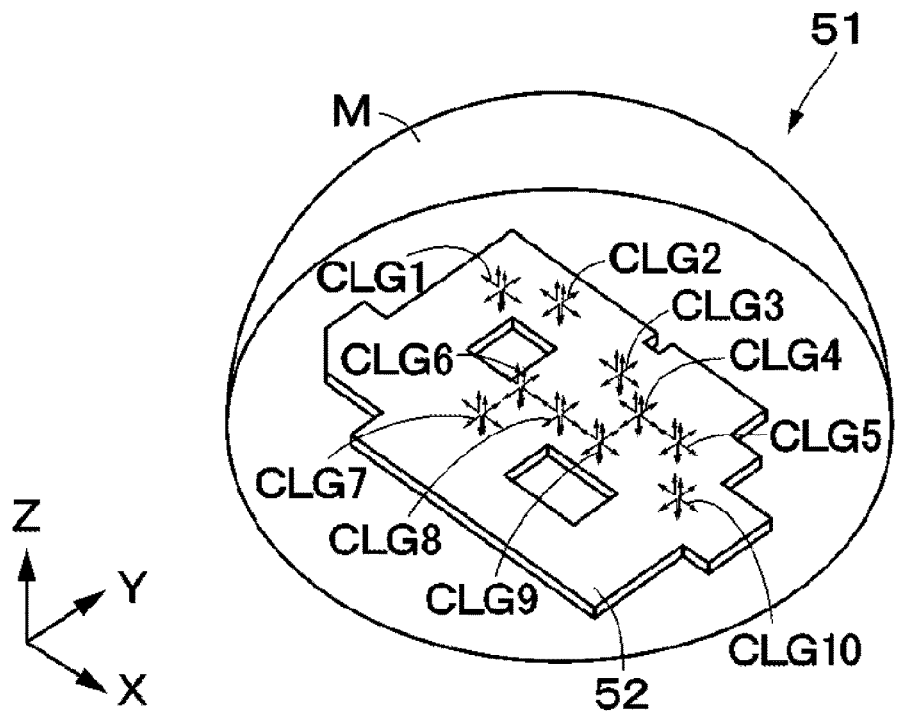
FIG. 23 is a perspective view illustrating an analytical model in the case of applying ten concentrated load groupings to a circuit board.

In Step 31, an analytical model 51 is constructed for the circuit board 52 to be analyzed (see FIG. 23). In this regard, the shape and size of the circuit board 52 are not particularly limited, but circuit boards for actual use are able to be applied. In addition, the circuit board 52 may have other components such as an IC and a metal case attached thereto, if necessary.

In Step 32, values corresponding to the MLCCs 1 mounted on the circuit board 52 are selected from values set for the parameters L1 to Ln, W1 to Wn, Fx1 to Fxn, Fy1 to Fyn, Fz1 to Fzn of the centered load groupings CLG1 to CLGn, which are registered in the library 44. For example, in the case of mounting ten types of MLCCs 1 corresponding to concentrated load groupings CLG1 to CLG 10 on the circuit board 52, values set for the parameters L1 to L10, W1 to W10, Fx1 to Fx10, Fy1 to Fy10, Fz1 to Fz10 are selected from the library 44.

In Step 33, the concentrated load groupings CLG1 to CLG 10 selected in Step 32 are applied to the circuit board 52 in the analytical model 51. In this case, the concentrated load groupings CLG1 to CLG 10 each have concentrated loads CLa to CLd, and the concentrated loads CLa to CLd are established such that the sum of the respective vectors is zero, and such that the torque is zero with respect to the center of gravity G.

In Step 34, the concentrated loads CLa to CLd of the concentrated load groupings CLG1 to CLG10 are set respectively to the values set for the parameters L1 to L10, W1 to W10, Fx1 to Fx10, Fy1 to Fy10, Fz1 to Fz10, which are selected in Step 32.

Figure 24:
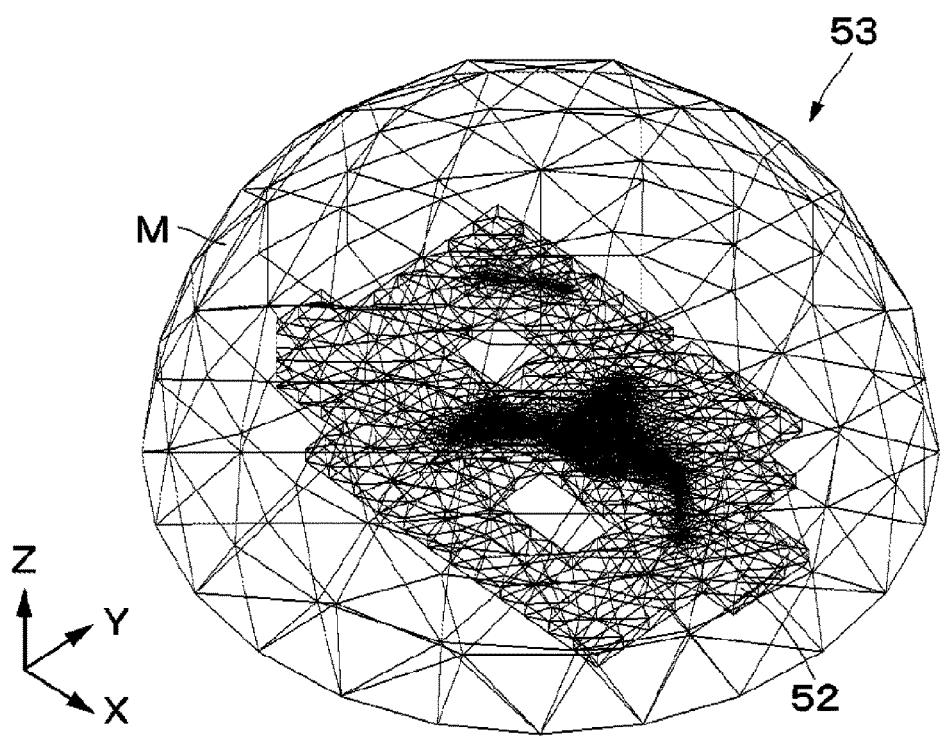
FIG. 24 is a perspective view illustrating a finite element model obtained by mesh division of the analytical model in FIG. 23.

In Step 35, a finite element model (hereinafter, referred to as a FEM model 53) is created by dividing the analytical model 51 into a finite large number of elements (see FIG. 24).

The mesh is finely formed around the concentrated load groupings CLG1 to CLG10 as compared with the other part in the mesh division. Furthermore, physical quantities within the mesh are allocated to the memory of the computer 42.

In Step 36, a simultaneous equation based on a stiffness equation is solved for the circuit board 52 in the FEM model 53 to figure out the vibration of the circuit board 52. In subsequent Step 37, a simultaneous equation based on an equation for fluid motion is solved for a medium M in the FEM model 53 to figure out the change in the pressure of the medium M on the basis of the vibration of the circuit board 52. Then, the sound pressure at an observation point P is figured out from the change in the pressure, and sound pressure-frequency characteristics in the frequency band B are recorded as calculation values. As just described, Steps 35 to 37 have almost the same process as Steps 4 to 6 according to the first embodiment and Steps 15 to 17 mentioned previously.

In Step 38, the sound pressure-frequency characteristics recorded in Step 37 are on the display device 13, and the process is ended.

It is to be noted that while a case of the circuit board 52 with one for each of ten types of MLCCs 1 mounted thereon as ten in total has been described as an example, the number of types of and the number of MLCCs 1 mounted thereon can be changed appropriately depending on conditions for actual mounting.

The analysis device 41 according to the second embodiment is configured as described previously, and next, there are comparisons made among actual measurement values obtained by measuring actual sound pressures, calculation values calculated with the use of the previously mentioned analysis device 41, and calculation values according to the comparative example with the MLCC 1 represented by the solid model 31. The results are shown in FIG. 25.

It is to be noted that the circuit board 7 used for the measurement in Step 11 was used for the results. More specifically, the circuit board 7 was made to have a simple rectangular shape, and in the center thereof, the MLCC 1 was disposed. In addition, the MLCC 1 used has the same external dimensions and electrostatic capacitance (1.6 mm in the X direction, 0.8 mm in the Y direction, and 0.8 mm in the Z direction, with electrostatic capacitance of 22 μF) as described previously, while the piezoelectric body 2 used differs in material constant and internal structure. For this reason, the analysis device 41 sets the parameters L, W, Fx, Fy, and Fz respectively to 1.6 mm, 0.8 mm, 0.0027 N, 0.0047 N, and 0.0092 N.

Figure 25:
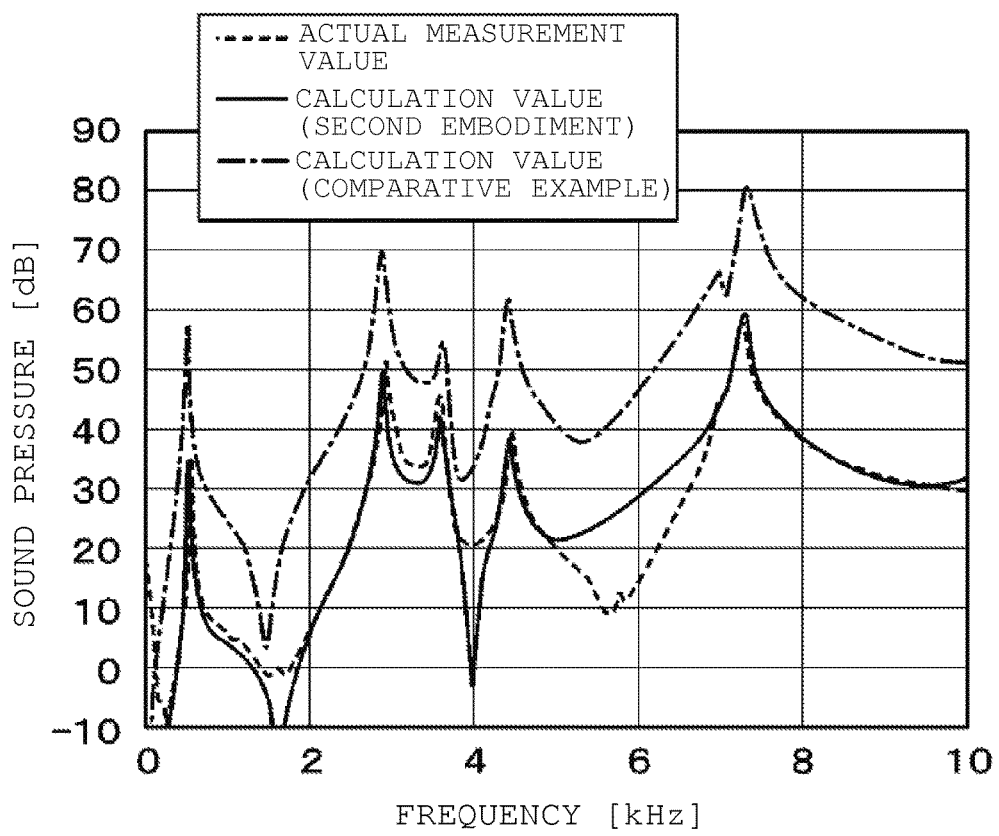
FIG. 25 is a characteristic line diagram showing actual measurement values and sound pressure-frequency characteristics according to the comparative example and the second embodiment.

As shown in FIG. 25, the actual measurement values are close to the values calculated by the analysis device 41, whereas the calculation values according to the comparative example have different values from the actual measurement values. The reason is believed to be because the complex structure of the MLCC 1 resulted in insufficient modeling of the solid model 31. More specifically, although the respective dimensions and the material constant were defined with, for example, 129 parameters when the solid model 31 was used, the modeling is still not considered sufficient. Moreover, because of the excessive number of parameters, there is also the problem of difficulty in adjusting the parameters.

In contrast, the analysis device 41 according to the second embodiment can adjust a small number of, for example, such as five, parameters to achieve sound pressure characteristics close to actual measurement values, and increase the accuracy of coincidence with actual measurement values.

In addition, the calculation time was 10 minutes 44 seconds in the case of the comparative example with the solid model 31, whereas the calculation time was 4 minutes 48 seconds in the case of the analysis device 41. As just described, according to the second embodiment, the calculation time can be also reduced to on the order of 45% as compared with the comparative example.

In this way, the second embodiment can also achieve the same function effect as in the first embodiment. In addition, in the second embodiment, the values set for the parameters L, W, Fx, Fy, Fz of the concentrated loads are determined so that a calculation value for sound pressure is close to an actual measurement value therefor. For this reason, the analysis device 41 can figure out a value for sound pressure, which is made close to an actual measurement value. In addition, in the case of the analysis device 41, the load acting on the circuit board 52 from the MLCC 1 is replaced with the four concentrated loads CLa to CLd, and the calculation value for sound pressure can be thus made close to the actual measurement value by adjusting the parameters L, W, Fx, Fy, Fz for each concentrated load. For this reason, as compared with the case of the MLCC 1 represented by the solid model 31, through the adjustment of a small number of (for example, five) parameters L, W, Fx, Fy, Fz, the calculation value for sound pressure can be easily made close to the actual measurement value, and the operational precision of the sound pressure can be increased with respect to the actual measurement value.

In addition, the analysis device 41 determines the values set for the parameters L, W, Fx, Fy, Fz of the concentrated loads so that a calculation value for sound pressure is close to an actual measurement value therefor around a band in which a maximal value for sound pressure is produced. For this reason, the calculation time required for the determination of the values set for the concentrated loads can be reduced as compared with when the calculated value for sound pressure is made close to the actual measurement value therefor over the entire band. In addition, the actual measurement value for sound pressure can be measured with a higher degree of accuracy around the band for the maximal value as compared with the other frequency range, the values set for the locations and magnitudes of the concentrated loads can be thus determined depending on the high-accuracy actual measurement value for sound pressure, and the operational precision of the sound pressure can be increased.

In addition, the analysis device 41 registers, in the library 44, values set for the parameters L1 to Ln, W1 to Wn, Fx1 to Fxn, Fy1 to Fyn, Fz1 to Fzn of the concentrated loads for multiple types of MLCCs 1. For this reason, there is no need to figure out again any values set for the parameters L1 to Ln, W1 to Wn, Fx1 to Fxn, Fy1 to Fyn, Fz1 to Fzn, but an acoustic noise phenomenon of the circuit board 52 can be easily analyzed by selecting, from the library 44, values set for the parameters L1 to Ln, W1 to Wn, Fx1 to Fxn, Fy1 to Fyn, Fz1 to Fzn depending on the type of the MLCC 1. Thus, for example, when a supplier that manufactures the MLCC 1 creates the library 44, a user that uses the MLCC 1 can analyze an acoustic noise phenomenon of the circuit board 52 with the use of the library 44 created by the supplier. As a result, in the case of designing the circuit board 52, a user can easily analyze an acoustic noise phenomenon of the circuit board 52 with the use of the library 44, without the need to contact the supplier for vibration characteristics or the like of the MLCC 1 used, and increase the efficiency for the circuit design.

Figure 18:
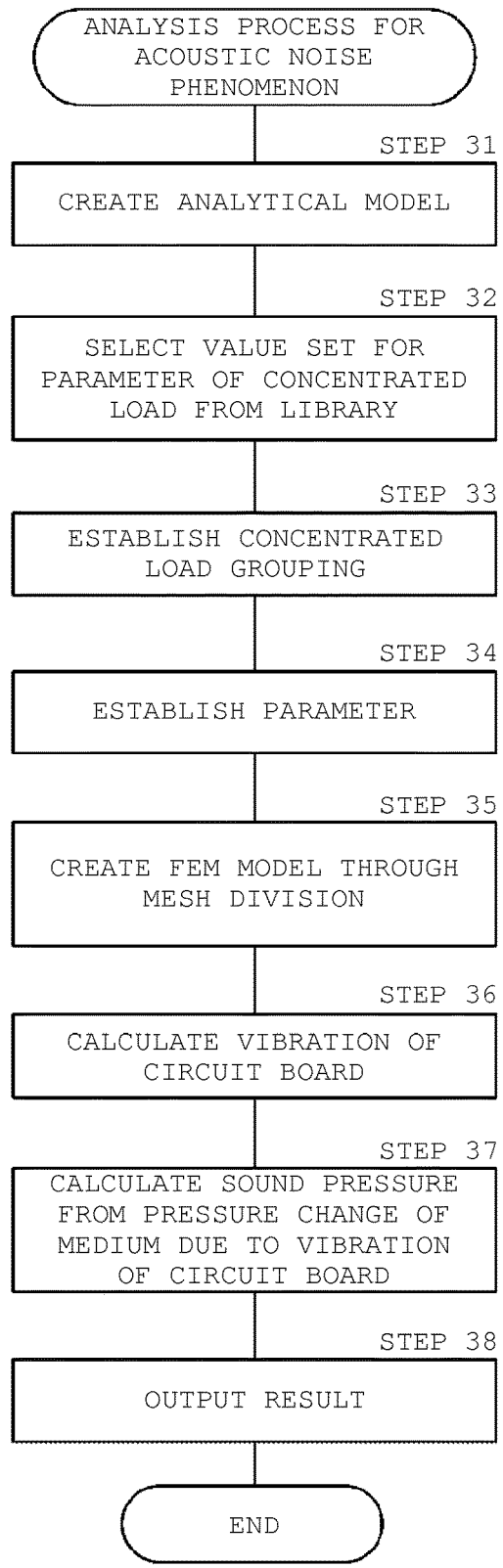
FIG. 18 is a flowchart showing an analysis process for an acoustic noise phenomenon with the analysis device in FIG. 15.

It is to be noted that in the respective embodiments, Steps 1 and 31 in FIGS. 4 and 18 provide specific examples of the model construction (model construction step), Steps 2 and 33 therein provide specific examples of the concentrated load grouping application (concentrated load grouping application step), Steps 5 and 36 therein provide specific examples of the board vibration calculation (board vibration calculation step), and Steps 6 and 37 therein provide specific examples of the sound pressure calculation (sound pressure calculation step). Furthermore, Steps 14 to 22 in FIG. 17 provide specific examples of the setting value determination (setting value determination step), Step 24 therein provides a specific example of the library registration (library registration step), and Step 32 in FIG. 18 provides a specific example of the setting value selection (setting value selection step).

The invention claimed is:

1. An analysis device that uses a finite element method to analyze an acoustic noise phenomenon of a circuit board with a multilayer ceramic capacitor mounted thereon, the analysis device comprising:
a controller, configured to:
control an oscillator to apply a concentrated load grouping including multiple concentrated loads to a circuit board structure representative of an analytical model including the circuit board and a medium, the concentrated loads representing physical vibrations imposed on the circuit board structure by the multilayer ceramic capacitor and being configured such that the sum of respective forces is zero and such that the torque is zero with respect to the center of gravity;
perform a board vibration calculation that determines vibration of the circuit board structure with the concentrated load grouping applied thereto, when the magnitudes of the respective concentrated loads are periodically changed with time; and
perform a sound pressure calculation that determines a sound pressure in the medium on the basis of a change in pressure of the medium due to the vibration of the circuit board structure as detected by a sound pressure measurement device.

2. The analysis device according to claim 1, wherein the controller is further configured to perform a setting value determination that determines values set for locations and magnitudes of the concentrated loads so that a calculation value for the sound pressure is close to an actual measurement value for the sound pressure.

3. The analysis device according to claim 2, wherein the setting value determination determines values set for the locations and magnitudes of the concentrated loads such that the calculation value for the sound pressure is close to the actual measurement value therefor around a band in which a maximal value is produced for the sound pressure when frequency characteristics are obtained for the sound pressure.

4. The analysis device according to claim 2, wherein the controller is further configured to perform:
a library registration that determines values set for the locations and magnitudes of the concentrated loads for each type of the multilayer ceramic capacitor, and registers the set values in a library; and
a setting value selection that selects, from the library, the values set for the concentrated loads depending on the type of the multilayer ceramic capacitor.

5. An analysis method for using a finite element method to analyze an acoustic noise phenomenon of a circuit board with a multilayer ceramic capacitor mounted thereon, the method comprising:
constructing a circuit board structure representative of an analytical model including the circuit board and a medium;
controlling, by a processor, an oscillator to apply a concentrated load grouping including multiple concentrated loads configured such that the sum of respective forces is zero and such that the torque is zero with respect to the center of gravity, to the circuit board structure in accordance with the multilayer ceramic capacitor;
determining, by the processor, vibration of the circuit board structure with the concentrated load grouping applied thereto, when the magnitudes of the respective concentrated loads are periodically changed with time; and
determining, by the processor, a sound pressure in the medium on the basis of the change in pressure of the medium due to the vibration of the circuit board structure as detected by a sound pressure measurement device.

* * * * *